United States Patent
Mizushima et al.

(10) Patent No.: US 7,138,650 B2
(45) Date of Patent: Nov. 21, 2006

(54) SEMICONDUCTOR SUBSTRATE, FIELD-EFFECT TRANSISTOR, AND THEIR MANUFACTURING METHOD OF THE SAME

(75) Inventors: Kazuki Mizushima, Tokyo (JP); Ichiro Shiono, Tokyo (JP); Kenji Yamaguchi, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 101 days.

(21) Appl. No.: 10/485,727

(22) PCT Filed: Aug. 2, 2002

(86) PCT No.: PCT/JP02/07903

§ 371 (c)(1),
(2), (4) Date: Feb. 4, 2004

(87) PCT Pub. No.: WO03/015140

PCT Pub. Date: Feb. 20, 2003

(65) Prior Publication Data

US 2004/0251458 A1 Dec. 16, 2004

(30) Foreign Application Priority Data

Aug. 6, 2001 (JP) .............................. 2001-238172
Dec. 27, 2001 (JP) .............................. 2001-396966

(51) Int. Cl.
*H01L 29/06* (2006.01)
*H01L 31/072* (2006.01)

(52) U.S. Cl. .......................... 257/19; 257/18; 438/933

(58) Field of Classification Search ................ 438/622, 438/623, 627, 618, 605, 933, FOR. 291; 257/192, 613–616, 18, 19
See application file for complete search history.

(56) References Cited

U.S. PATENT DOCUMENTS 5,221,413 A  6/1993  Brasen et al.
5,442,205 A  8/1995  Brasen et al.

(Continued)

FOREIGN PATENT DOCUMENTS

CN  1289149 A  3/2001

(Continued)

OTHER PUBLICATIONS

Korean Office Action issued in Korean Application No. 10-2004-7001728 dated Oct. 31, 2005.

(Continued)

*Primary Examiner*—Zandra V. Smith
*Assistant Examiner*—Thanh Y. Tran
(74) *Attorney, Agent, or Firm*—Pillsbury Winthrop Shaw Pittman LLP

(57) ABSTRACT

A semiconductor substrate, a field effect transistor and their manufacturing methods provided with, in order to lower penetrating dislocation density and reduce surface roughness to a practical level, an Si substrate 1, a first SiGe layer 2 on the Si substrate, and a second SiGe layer 3 arranged on the first SiGe layer either directly or with an Si layer in between; wherein, the first SiGe layer has a film thickness that is thinner than twice the critical film thickness, which is the film thickness at which dislocation occurs resulting in lattice relaxation due to increased film thickness, the Ge composition ratio of the second SiGe layer is at least lower than the intralayer maximum value of the Ge composition ratio in the first SiGe layer or in the first SiGe layer at the contact surface with the Si layer, and the second SiGe layer has an incremental composition region in which the Ge composition ratio gradually increases towards the surface at least in a portion thereof.

28 Claims, 19 Drawing Sheets

U.S. PATENT DOCUMENTS

| | | | |
|---|---|---|---|
| 5,534,713 | A | 7/1996 | Ismail et al. |
| 5,663,516 | A | 9/1997 | Mishima et al. |
| 5,906,951 | A | 5/1999 | Chu et al. |
| 6,059,895 | A | 5/2000 | Chu et al. |
| 6,339,232 | B1* | 1/2002 | Takagi .................. 257/192 |
| 6,369,438 | B1* | 4/2002 | Sugiyama et al. .......... 257/616 |
| 2002/0052084 | A1* | 5/2002 | Fitzgerald ............... 438/282 |
| 2002/0125475 | A1 | 9/2002 | Chu et al. |

FOREIGN PATENT DOCUMENTS

| | | |
|---|---|---|
| DE | 100 11 054 A1 | 9/2000 |
| EP | 0 683 522 A2 | 11/1995 |
| JP | 6-252046 | 9/1994 |
| JP | 07-321222 | 12/1995 |
| JP | 08-037291 | 2/1996 |
| JP | 09-180999 | 7/1997 |
| JP | 10-308503 | 11/1998 |
| JP | 2000-286413 | 10/2000 |
| KR | 1998-081556 | 11/1998 |
| TW | 388969 | 5/2000 |
| WO | WO 98/00857 | 1/1998 |

OTHER PUBLICATIONS

Yutani and Shiraki, "Hybrid MBE growth and mobility limiting factors of *n*-channel Si/SiGe modulation-doped systems", Journal of Crystal Growth, 175/176 pp. 504-508 (1997).

Li et al., "Effect of low-temperature SiGe interlayer on the growth of relaxed SiGe", Journal of Crystal Growth, 213, pp. 308-311 (2000).

* cited by examiner

FIG. 13

| FILM THICKNESS 350 nm | Ge COMPOSITION RATIO 0.2 |
|---|---|
| | RMS (nm) |
| PRIOR ART | 2.73 |
| SECOND EMBODIMENT | 1.69 |
| THIRD EMBODIMENT | 1.62 |
| FOURTH EMBODIMENT | 1.89 |
| FIFTH EMBODIMENT | 2.09 |

US 7,138,650 B2

SEMICONDUCTOR SUBSTRATE, FIELD-EFFECT TRANSISTOR, AND THEIR MANUFACTURING METHOD OF THE SAME

This is the U.S. National Stage of International Application No. PCT/JP02/07903, filed Aug. 2, 2002, the contents of which are incorporated herein in their entirety by reference.

TECHNICAL FIELD

The present invention relates to a semiconductor substrate and field effect transistor used in high-speed MOSFETs and other similar devices, and manufacturing methods of the same.

BACKGROUND ART

High-speed MOSFET, MODFET and HEMT have been proposed in recent years in which an epitaxially grown strained Si layer interposed with an SiGe (silicon-germanium) layer on a Si (silicon) substrate is used for the channel region. In this strained Si-FET, tensile strain occurs in the Si layer due to the SiGe having a larger lattice constant than the Si, and as a result, the band structure of the Si changes, degeneration is removed and carrier mobility increases. Thus, as a result of using this strained Si layer as a channel region, speed can be increased to about 1.3 to 8 times faster than ordinary speeds. In addition, since ordinary Si substrates can be used for the substrates and the CZ (Czochralski method) can be used for the process, high-speed CMOS can be realized with a conventional CMOS process.

However, although epitaxial growth of a high-quality SiGe layer on an Si substrate is required for epitaxial growth of the aforementioned strained Si layer that is desired to be used as the channel region of an FET, due to the difference in the lattice constants between Si and SiGe, there were problems with crystallinity due to dislocation and so forth. Consequently, the following types of proposals have been made in the prior art.

Examples of methods that have been proposed include a method that uses a buffer layer in which the composition ratio of Ge in the SiGe is changed at constant, gradual increments, a method that uses a buffer layer in which the composition ratio of Ge (Germanium) is changed in steps, a method that uses a buffer layer in which the Ge composition ratio is changed in the form of a super lattice, and a method that uses a buffer layer in which the Ge composition ratio is changed at a constant increment using an Si off-cut wafer (in, for example, U.S. Pat. No. 5,442,205, U.S. Pat. No. 5,221,413, PCT WO98/00857 and Japanese Unexamined Patent Application, First Publication No. 6-252046).

However, the aforementioned examples of the prior art still had the problems described below.

Namely, the SiGe layer deposited using the aforementioned prior art was in a state such that the penetrating dislocation density and surface roughness did not reach the level desirable for use in device and manufacturing processes.

For example, in the case of using a buffer layer in which the Ge composition ratio is changed incrementally, although penetrating dislocation density can be made to be comparatively low, there is the problem of poor surface roughness. Conversely, in the case of using a buffer layer in which the Ge composition ratio is changed in steps, although surface roughness can be made to be comparatively low, there is the problem of large penetrating dislocation density. In addition, in the case of using an off-cut wafer, although dislocation easily passes through in the lateral direction and not the direction of deposition, it is still not possible to achieve an adequate reduction in dislocation. Surface roughness has also not reached the level required by photolithography processes used for LSI and so forth in recent years.

DISCLOSURE OF THE INVENTION

In consideration of the aforementioned problems, the object of the present invention is to provide a semiconductor substrate, field effect transistor and manufacturing methods thereof that are capable of lowering penetrating dislocation density and surface roughness to practical levels.

The present invention employs the following constitution in order to solve the aforementioned problems. Namely, the semiconductor substrate of an aspect of the present invention is provided with an Si substrate, a first SiGe layer on the Si substrate, and a second SiGe layer on the first SiGe layer either directly or with an Si layer arranged between the second SiGe layer and the first SiGe layer; wherein, the first SiGe layer has a film thickness that is thinner than twice the critical film thickness, which is the film thickness at which dislocation occurs resulting in lattice relaxation due to increased film thickness, the Ge composition ratio of the second SiGe layer is at least lower than the intralayer maximum value of the Ge composition ratio in the first SiGe layer or in the first SiGe layer at the contact surface with the Si layer, and the second SiGe layer has an incremental composition region in which the Ge composition ratio gradually increases towards the surface at least in a portion thereof.

In addition, the manufacturing method of a semiconductor substrate of an aspect of the present invention is a manufacturing method of a semiconductor substrate in which an SiGe layer is epitaxially grown on an Si substrate, and comprises a first layer formation step in which a first SiGe layer is epitaxially grown on the Si substrate, a second layer formation step in which a second SiGe layer is epitaxially grown on the first SiGe layer either directly or with an epitaxially grown Si layer arranged between the first SiGe layer and the second SiGe layer, in the first layer formation step, the film thickness of the first SiGe layer is set to be thinner than twice the critical film thickness, which is the film thickness at which dislocation occurs resulting in lattice relaxation due to increased film thickness, and in the second layer formation step, the Ge composition ratio of the second SiGe layer is at least lower than the intralayer maximum value of the Ge composition ratio in the first SiGe layer or in the first SiGe layer at the contact surface with the Si layer, and an incremental composition region is formed in which the Ge composition ratio is increased gradually towards the surface in at least a portion thereof.

In addition, the semiconductor substrate of an aspect of the present invention is a semiconductor substrate in which an SiGe layer is formed on an Si substrate, and is fabricated by the aforementioned semiconductor substrate manufacturing method of an aspect of the present invention.

The present invention employs the following constitution to solve the aforementioned problems. Namely, the semiconductor substrate of an aspect of the present invention is provided with an Si substrate, a first SiGe layer on the Si substrate, and a second SiGe layer on the first SiGe layer either directly or with an Si layer arranged between the second SiGe layer and the first SiGe layer; wherein, the first SiGe layer has a film thickness that is thinner than twice the critical film thickness, which is the film thickness at which dislocation occurs resulting in lattice relaxation due to increased film thickness, the second SiGe layer is composed by laminating multiple layers of an SiGe incremental composition layer, in which the Ge composition ratio gradually increases towards the surface, and an SiGe constant composition layer, which is arranged on an incremental composition layer at the Ge composition ratio of the upper surface of the incremental composition layer, at an alternating and continuous Ge composition ratio, and the Ge composition ratio of the lower surface of the second SiGe layer is lower than the intralayer maximum value of the Ge composition ratio in the first SiGe layer.

In addition, the manufacturing method of a semiconductor substrate of an aspect of the present invention is a manufacturing method of a semiconductor substrate in which an SiGe layer is epitaxially grown on an Si substrate, comprising: a first layer formation step in which a first SiGe layer is epitaxially grown on the Si substrate, and a second layer formation step in which a second SiGe layer is epitaxially grown on the first SiGe layer either directly or with an epitaxially grown Si layer arranged between the first SiGe layer and the second SiGe layer, in the first layer formation step, the film thickness of the first SiGe layer is set to be thinner than twice the critical film thickness, which is the film thickness at which dislocation occurs resulting in lattice relaxation due to increased film thickness, and in the second layer formation step, a step in which an SiGe incremental composition layer, in which the Ge composition ratio is gradually increased towards the surface, is epitaxially grown, and a step in which an SiGe constant composition layer is epitaxially grown on the incremental composition layer at the final Ge composition ratio of the incremental composition layer, are repeated a plurality of times at a continuous Ge composition ratio, the second SiGe layer is deposited in which the Ge composition ratio changes in steps at an increment in the direction of deposition, and the Ge composition ratio of the lower surface of the second SiGe layer is lower than the intralayer maximum value of the Ge composition ratio in the first SiGe layer.

In addition, the semiconductor substrate of an aspect of the present invention is a semiconductor substrate in which an SiGe layer is formed on an Si substrate, and is fabricated by the aforementioned semiconductor substrate manufacturing method of an aspect of the present invention.

In this semiconductor substrate and semiconductor substrate manufacturing method, the film thickness of the first SiGe layer is set to be thinner than twice the critical film thickness, which is the film thickness at which dislocation occurs resulting in lattice relaxation due to increased film thickness, the Ge composition ratio of the second SiGe layer is at least lower than the intralayer maximum value of the Ge composition ratio in the first SiGe layer or in the first SiGe layer at the contact surface with the Si layer, and the second SiGe layer has an incremental composition region in which the Ge composition ratio is gradually increased towards the surface in at least a portion thereof. In addition, the Ge composition ratio of the lower surface of the second SiGe layer is lower than the intralayer maximum value of the Ge composition ratio in the first SiGe layer. Consequently, dislocation can be efficiently concentrated in the vicinity of the interface between the Si substrate and the first SiGe layer and the interface of the first SiGe layer and the second SiGe layer, thereby making it possible to reduce penetrating dislocation density and surface roughness on the surface of the second SiGe layer.

Namely, since a first SiGe layer is deposited to be thinner than twice the critical film thickness, although strain energy corresponding to film thickness during deposition of the first SiGe layer, there is hardly any occurrence of dislocation. Next, when epitaxial growth of the second SiGe layer is begun, since strain energy is already accumulated in the first SiGe layer, the generation of dislocation and growth begin from the interfaces on both sides of the first SiGe layer and from the side of the first SiGe layer within the second SiGe layer at the stage the film thickness of the second SiGe layer is thin, and lattice relaxation of the first SiGe layer and second SiGe layer begins. At this time, since the Ge composition ratio of the second SiGe layer is lower than the intralayer maximum value of the Ge composition ratio in the first SiGe layer or in the first SiGe layer at the contact surface with the aforementioned Si layer, dislocation occurs concentrated along the interfaces on both sides of the first SiGe layer, the generation of dislocation at the interfaces on both sides of the first SiGe layer assists in lattice relaxation of the second SiGe layer, and together with the generation of dislocation and growth within the second SiGe layer being inhibited, worsening of surface roughness of the surface of the second SiGe layer is also inhibited.

Moreover, the first SiGe layer functions as a layer that removes moisture, oxygen components, carbon components and other impurities on the surface of the Si substrate, and is effective for inhibiting defects in the Si substrate caused by surface contamination.

Moreover, in the incremental composition region of the second SiGe layer, together with dislocation being generated uniformly, interaction occurs between the dislocation, and the dislocation density within the incremental composition region decreases, and as a result of the growth of dislocation being induced in the lateral direction, penetrating dislocation density in the surface region decreases, thereby also being effective for inhibiting worsening of surface roughness.

In a conventional incremental composition region in which there is no first SiGe layer, the generation of dislocation begins when the film thickness of the incremental composition region becomes equal to or greater than a predetermined film thickness and exceeds the critical film thickness, and after having once gone through an increase in dislocation density, the aforementioned effects are obtained in the case an incremental composition region is additionally formed. Namely, in the structure of the prior art, the aforementioned effects are only obtained in a portion of the region on the upper side of the incremental composition region.

On the other hand, in the structure of an aspect of the present invention in which there is a first SiGe layer, since strain energy is already accumulated in the first SiGe layer, and the generation of dislocation begins within the second SiGe layer at the stage the film thickness of the second SiGe layer is still thin, the aforementioned effects are obtained throughout the entire incremental composition region within the second SiGe layer, penetrating dislocation density in the surface region of the second SiGe layer decreases, and worsening of surface roughness is inhibited.

Moreover, the first SiGe layer functions as a layer that removes moisture, oxygen components, carbon components and other impurities on the surface of the Si substrate, and is effective for inhibiting defects in the Si substrate caused by surface contamination.

Furthermore, when dislocation begins to be generated during deposition of the first SiGe layer, since dislocation begins to grow in multiple directions, it is difficult to inhibit the direction in which dislocation grows, thereby making it difficult to reduce penetrating dislocation and surface roughness. Therefore, it is necessary to set the film thickness of the first SiGe layer to a film thickness that is thinner than film thickness at which remarkable generation of dislocation and lattice relaxation actually begin within a range that does not exceed twice the critical film thickness. At the same time, it is more effective to make the film thickness of the first SiGe layer as close as possible to the film thickness at which remarkable generation of dislocation and lattice relaxation actually begin. The film thickness at which remarkable generation of dislocation and lattice relaxation actually begin varies depending on the temperature conditions of deposition and so forth. Therefore, a film thickness at which the effects of the present invention are effectively obtained should be selected that is near the film thickness at which remarkable generation of dislocation and lattice relaxation actually begin within a range that does not exceed twice the critical film thickness under each of the deposition conditions.

In addition, since a second SiGe film is obtained in which a plurality of layers are laminated at an alternating and continuous Ge composition ratio consisting of an SiGe incremental composition layer, in which the Ge composition ratio increases gradually towards the surface, and an SiGe constant composition layer, arranged on an incremental composition layer at the Ge composition ratio of the upper surface of the incremental composition layer, the Ge composition ratio is in the form of incremental steps throughout the second SiGe layer, dislocation occurs easily in the lateral direction at the interface, and together with it being difficult for penetrating dislocation to occur, since there is little change in the composition at the interface, the occurrence of dislocation at the interface is inhibited, intralayer dislocation of the incremental composition layer occurs uniformly, and worsening of surface roughness can be inhibited.

As a result of conducting research on SiGe deposition technology, the inventors of the present invention found that dislocation within crystals exhibits the tendencies described below.

Namely, when depositing an SiGe layer, dislocation that occurs during deposition has the characteristic of being likely to propagate either in a diagonal direction or lateral direction (direction perpendicular to the direction of deposition: <110> direction) relative to the direction of deposition. In addition, although dislocation tends to propagate easily in the lateral direction at the layer interface, in the case of an interface in which the composition changes rapidly, together with being likely to propagate in the aforementioned diagonal direction, numerous dislocation is thought to occur at high density.

Thus, when deposition is carried out in which the Ge composition ratio is in the form of simple steps, together with considerable dislocation occurring at high density at the interface sections where there are rapid changes in composition, dislocation easily propagates in a direction diagonal to the direction of deposition, thereby resulting in a high risk of penetrating dislocation. In addition, in the case of deposition in which the Ge composition ratio is simply incremented gradually, there are no sections (such as interfaces) that offer an opportunity for the dislocation propagating in the aforementioned diagonal direction to escape to the lateral direction, and the dislocation is thus thought to end up penetrating to the surface.

In contrast, in the semiconductor substrate manufacturing method of an aspect of the present invention, a step in which an SiGe incremental composition layer, in which the Ge composition ratio is gradually increased towards the surface, is epitaxially grown, and a step in which an SiGe constant composition layer is epitaxially grown on an incremental composition layer at the final Ge composition ratio of the incremental composition layer, are repeated a plurality of times at a continuous Ge composition ratio, and the second SiGe layer is deposited in which the Ge composition ratio changes in steps at increments in the direction of deposition, the incremental composition layers and constant composition layers are formed alternately in a plurality of steps resulting in a layer in which the Ge composition ratio is incremented in steps, thereby enabling the formation of an SiGe layer in which both dislocation density and surface roughness are low.

Namely, dislocation at an interface propagates easily in the lateral direction making it difficult for penetrating dislocation to occur. In addition, since there is little change in composition at an interface, the occurrence of dislocation at the interface is inhibited, dislocation occurs uniformly within the incremental composition layers, and worsening of surface roughness can be inhibited.

Moreover, in the incremental composition region of the second SiGe layer, together with dislocation being generated uniformly, interaction occurs between the dislocation, and the dislocation density within the incremental composition region decreases, and as a result of the growth of dislocation being induced in the lateral direction, penetrating dislocation density in the surface region decreases, thereby also being effective for inhibiting worsening of surface roughness.

In a conventional incremental composition region in which there is no first SiGe layer, the generation of dislocation begins when the film thickness of the incremental composition region becomes equal to or greater than a predetermined film thickness and exceeds the critical film thickness, and after having once gone through an increase in dislocation density, the aforementioned effects are obtained in the case an incremental composition region is additionally formed. Namely, in the structure of the prior art, the aforementioned effects are only obtained in a portion of the region on the upper side of the incremental composition region.

On the other hand, in the structure of the present invention in which there is a first SiGe layer, since strain energy is already accumulated in the first SiGe layer, and the generation of dislocation begins within the second SiGe layer at the stage the film thickness of the second SiGe layer is still thin, the aforementioned effects are obtained throughout the entire incremental composition region within the second SiGe layer, penetrating dislocation density in the surface region of the second SiGe layer decreases, and worsening of surface roughness is inhibited.

In addition, in the semiconductor substrate of an aspect of the present invention, technology is employed in which the Ge composition ratio of the first SiGe Layer is constant, and is of a thickness that is less than twice a critical film thickness $t_c$ that satisfies the following relational expression:

$$t_c(\text{nm})=(1.9\times10^{-3}/\epsilon(x)^2)\cdot\ln(t_c/0.4)$$

$$\epsilon(x)=(0.0200326x+0.0026174x^2)/a_0$$

$a_0=0.543$ nm ($a_0$ is the lattice constant of Si).

In addition, in the first layer formation step of the semiconductor substrate manufacturing method of an aspect of the present invention, technology is employed in which the Ge composition ratio of the first SiGe layer is constant, and the first SiGe layer is of a thickness that is less than twice a critical film thickness $t_c$ that satisfies the following relational expression:

$$t_c(\text{nm})=1.9\times10^{-3}/\epsilon(x)^2\cdot\ln(t_c/0.4)$$

$$\epsilon(x)=(0.0200326x+0.0026174x^2)/a_0$$

$a_0=0.543$ nm ($a_0$ is the lattice constant of Si).

In this semiconductor substrate and semiconductor substrate manufacturing method, since the Ge composition ratio of the first SiGe layer is constant, there are the advantages of the film thickness at which remarkable generation of dislocation and lattice relaxation actually begin at the same Ge composition ratio being the thinnest, the effects of the present invention being obtained at the thinnest film thickness, and the amount of time required for deposition being short. In addition, in this semiconductor substrate and semiconductor substrate manufacturing method, by making the first SiGe layer of a thickness that is less than twice the critical film thickness $t_c$ which satisfies the aforementioned relational expression (referring to the film thickness at which dislocation calculated from the Ge composition ratio and lattice constant only occurs resulting in lattice relaxation regardless of the deposition temperature), the film thickness of the first SiGe layer can easily be set to within a film thickness at which remarkable generation of dislocation and lattice relaxation actually begin.

Namely, since the film thickness at which remarkable generation of dislocation and lattice relaxation actually begins changes according to the deposition temperature, if the film thickness is made to be less than twice the ideal critical film thickness $t_c$ theoretically determined from only the Ge composition ratio x and the lattice constant, it becomes thinner than the film thickness at which remarkable generation of dislocation and lattice relaxation actually begin, thereby allowing the effects of the present invention to be obtained. Furthermore, since the aforementioned critical film thickness is premised on being deposited in an equilibrium state, although it is determined with only the Ge composition ratio and lattice constant regardless of the deposition temperature, the film thickness at which remarkable generation of dislocation and lattice relaxation actually begin includes not only an equilibrium state, but also deposition in non-equilibrium state such as low-temperature growth, and is determined corresponding to deposition temperature.

In addition, in the semiconductor substrate of an aspect of the present invention, the Ge composition ratio x of the first SiGe layer is preferably from 0.05 to 0.3.

In addition, in the semiconductor substrate manufacturing method of an aspect of the present invention, the Ge composition ratio x of the first SiGe layer is preferably from 0.05 to 0.3.

In addition, in the semiconductor substrate manufacturing method of an aspect of the present invention, a semiconductor substrate is preferably produced in which a strained Si layer is formed on an Si substrate with an SiGe layer in between the strained Si layer and Si substrate, and the strained Si layer is preferably grown on a second SiGe layer of the semiconductor substrate either directly or with another SiGe layer in between.

The semiconductor substrate of an aspect of the present invention is characterized by being a semiconductor substrate in which an SiGe layer is formed on an Si substrate, and is produced according to the aforementioned semiconductor substrate manufacturing method of the present invention. Namely, since this semiconductor substrate is produced according to the aforementioned semiconductor substrate manufacturing method of the present invention, there is little penetrating dislocation of the surface and it has satisfactory surface roughness.

In this semiconductor substrate and semiconductor substrate manufacturing method, since the Ge composition ratio of the first SiGe layer is from 0.05 to 0.3, the film thickness at which remarkable generation of dislocation and lattice relaxation actually begins is neither too thin or too thick, and the effects of the present invention are effectively obtained with a first SiGe layer of a suitable thickness.

Namely, in the case the Ge composition ratio x of the first SiGe layer is less than 0.05, since the film thickness at which remarkable generation of dislocation and lattice relaxation actually begins becomes excessively thick, the time required to deposit the first SiGe layer becomes long, and the surface roughness of the first SiGe layer worsens.

On the other hand, in the case the Ge composition ratio x of the first SiGe layer is greater than 0.3, since generation of dislocation and lattice relaxation actually end up beginning at an extremely thin film thickness, it is difficult to form the first SiGe layer with satisfactory controllability.

In addition, if the aforementioned Ge composition ratio x of the first SiGe layer is from 0.05 to 0.3, the film thickness at which remarkable generation of dislocation and lattice relaxation actually begin becomes a suitable thickness, dislocation occurs concentrated along the interfaces on both sides of the first SiGe layer, and the effect in which the generation of dislocation at the interfaces on both sides of the first SiGe layer assists in lattice relaxation of the second SiGe layer is effectively obtained.

In addition, in the semiconductor substrate of an aspect of the present invention, a structure is employed in which the second SiGe layer is arranged directly on the first SiGe layer, and the entire layer is in the form of an incremental composition layer in which the Ge composition ratio has been gradually increased towards the surface.

In addition, in the semiconductor substrate manufacturing method of an aspect of the present invention, a method is employed in which the second SiGe layer is arranged directly on the first SiGe layer, and the entire layer is in the form of an incremental composition layer in which the Ge composition ratio has been gradually increased towards the surface.

In addition, the semiconductor substrate of an aspect of the present invention is characterized by being a semiconductor substrate in which an SiGe layer is formed on an Si substrate, and is produced according to the aforementioned semiconductor substrate manufacturing method of the present invention.

The semiconductor substrate of an aspect of the present invention is characterized by epitaxial growth of a strained Si layer on the second SiGe layer either directly or with another SiGe layer in between.

The semiconductor substrate manufacturing method of an aspect of the present invention is characterized by having a step in which a strained Si layer is epitaxially grown on the second SiGe layer either directly or with another SiGe layer in between.

In addition, the semiconductor substrate of an aspect of the present invention is characterized by being a semiconductor substrate in which a strained Si layer is formed on an Si substrate with an SiGe layer in between, and is produced according to the aforementioned semiconductor substrate manufacturing method of the present invention.

In this semiconductor substrate and semiconductor substrate manufacturing method, since the second SiGe layer is directly arranged on the first SiGe layer, and the entire layer is in the form of an incremental composition layer in which the Ge composition ratio is gradually increased towards the surface, layers required for obtaining the effects of the present invention are not provided wastefully and the effects of the present invention are obtained with the thinnest film thickness, thereby offering the advantage of a short time required for deposition.

In this semiconductor substrate and semiconductor substrate manufacturing method, since a strained Si layer is epitaxially grown on the second SiGe layer either directly or with another SiGe layer in between, there are few defects, a high-quality strained Si layer is obtained having little surface roughness, and a semiconductor substrate can be obtained that is suitable for use in, for example, an integrated circuit using a MOSFET and so forth in which the strained Si layer is used as a channel region.

The semiconductor substrate of an aspect of the present invention is characterized by epitaxial growth of a strained Si layer on the aforementioned SiGe layer either directly or with another SiGe layer in between.

In addition, the semiconductor substrate manufacturing method of an aspect of the present invention is characterized by epitaxially growing a strained Si layer on the aforementioned SiGe layer either directly or with another SiGe layer in between.

In addition, the semiconductor substrate of an aspect of the present invention is characterized by being a semiconductor substrate in which a strained Si layer is formed on an Si substrate with an SiGe layer in between, and is produced according to the aforementioned semiconductor substrate manufacturing method of the present invention in which a strained Si layer is grown.

In this semiconductor substrate and semiconductor substrate manufacturing method, since a strained Si layer is epitaxially grown on the SiGe layer either directly or with another SiGe layer in between, there are few defects, a high-quality strained Si layer is obtained having little surface roughness, and the semiconductor substrate and its manufacturing method are suitable for use in, for example, an integrated circuit using a MOSFET and so forth in which the strained Si layer is used as a channel region.

The field effect transistor of an aspect of the present invention is characterized by being a field effect transistor having a channel region in a strained Si layer on an SiGe layer, and having the channel region in the strained Si layer of the semiconductor substrate of the present invention.

In addition, the field effect transistor manufacturing method of an aspect of the present invention is characterized by being a field effect transistor manufacturing method in which a channel region is formed in a strained Si layer epitaxially grown on an SiGe layer, and forms the channel region in the strained Si layer of a semiconductor substrate produced according to the aforementioned semiconductor substrate manufacturing method of the present invention.

In addition, the field effect transistor of an aspect of the present invention is characterized by being a field effect transistor in which a channel region is formed in a strained Si layer epitaxially grown on an SiGe layer, and being produced according to the field effect transistor manufacturing method of the present invention.

In addition, the field effect transistor manufacturing method of an aspect of the present invention is characterized by being a field effect transistor manufacturing method in which a channel region is formed in a strained Si layer epitaxially grown on an SiGe layer, and forms the channel region in the strained Si layer of a semiconductor substrate produced according to the semiconductor substrate manufacturing method of the present invention in which the semiconductor substrate has a strained Si layer.

In addition, the field effect transistor of an aspect of the present invention is characterized by being a field effect transistor in which a channel region is formed in a strained Si layer epitaxially grown on an SiGe layer, and is produced according to the field effect transistor manufacturing method of the present invention.

In this field effect transistor and field effect transistor manufacturing method, since the channel region is formed in the strained Si layer of the semiconductor substrate of the present invention or a semiconductor substrate produced according to the semiconductor substrate manufacturing method of the present invention, a high-performance field effect transistor can be obtained at high yield due to a high-quality strained Si layer.

BRIEF DESCRIPTION OF THE DRAWINGS

FIG. 13 is a table showing the respective surface roughness in embodiments corresponding to the second through fifth embodiments as claimed in the present invention.

BEST MODE FOR CARRYING OUT THE INVENTION

Figure 1:
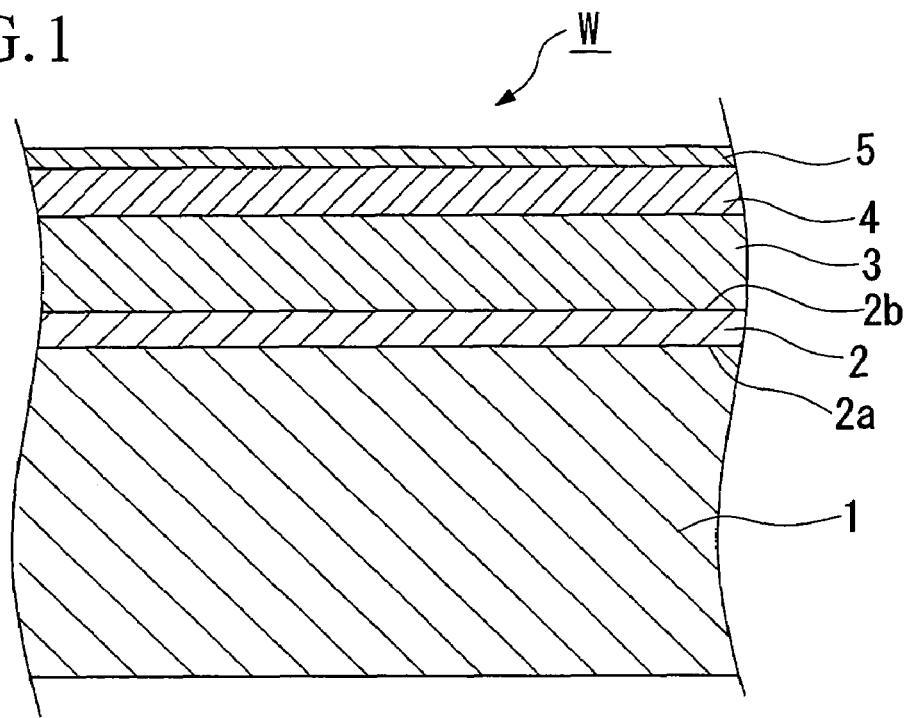
FIG. 1 is a cross-sectional view showing a semiconductor substrate in a first embodiment as claimed in the present invention.
Figure 2:
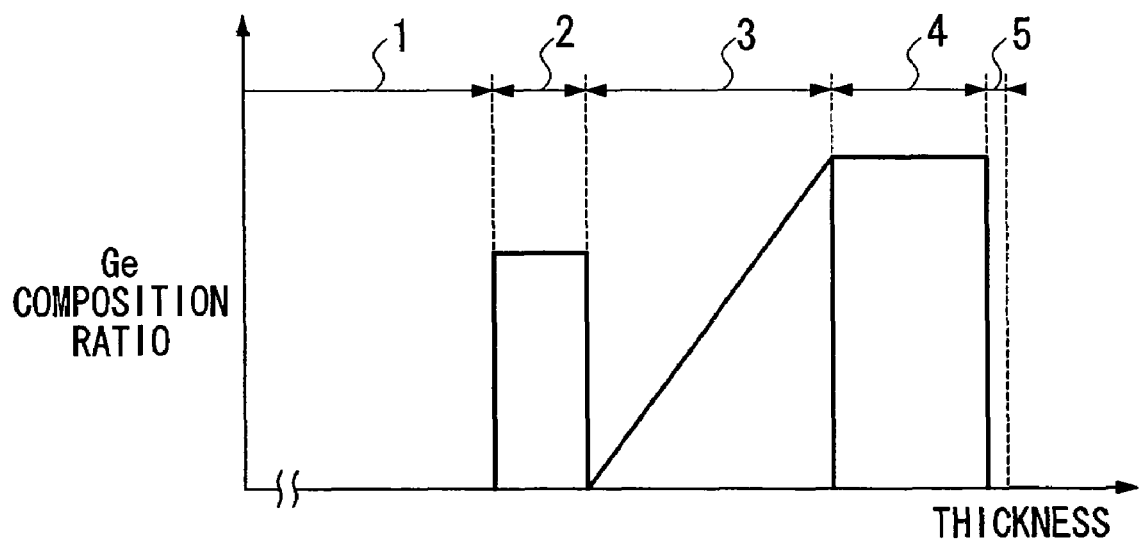
FIG. 2 is a graph showing the Ge composition ratio versus the film thickness of a semiconductor substrate in a first embodiment as claimed in the present invention.
Figure 3:
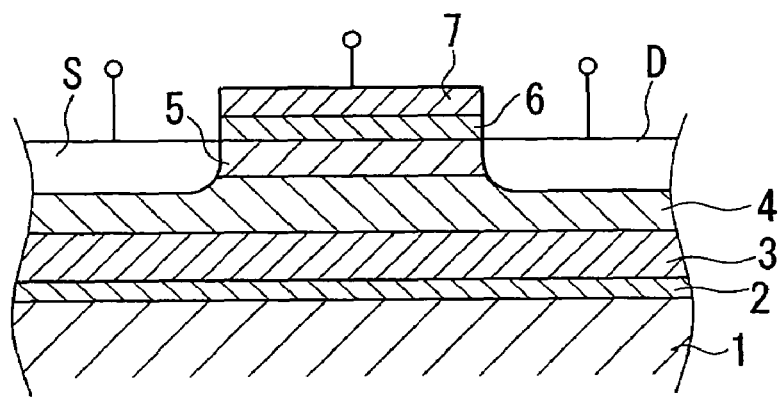
FIG. 3 is a schematic cross-sectional view showing a MOSFET in a first embodiment as claimed in the present invention.

The following provides an explanation of a first embodiment as claimed in the present invention with reference to FIGS. 1 through 3.

FIG. 1 shows the cross-sectional structure of a semiconductor wafer (semiconductor substrate) W of the present invention. The following provides an explanation of the structure of this semiconductor wafer along with its manufacturing process. First, as shown in FIGS. 1 and 2, a first SiGe layer 2, in which the Ge composition ratio x is constant (e.g., x=0.15) and which has a thickness that is thinner than the film thickness at which remarkable generation of dislocation and lattice generation actually begins (e.g., 300 nm), is epitaxially grown by, for example, a vacuum CVD method on a p-type or n-type Si substrate 1 produced by drawing and growing using the CZ method and so forth.

At this time, since the first SiGe layer 2 is deposited thinner than the film thickness at which remarkable generation of dislocation and lattice relaxation actually begins, although strain energy increases corresponding to film thickness during deposition of first SiGe layer 2, there is hardly any occurrence of dislocation or lattice relaxation.

Furthermore, the thickness of first SiGe layer 2 is a thickness that is less than twice the critical film thickness $t_c$ which satisfies the following relational expression:

$t_c(nm)=(1.9\times10^{-3}/\epsilon(x)^2)\cdot\ln(t_c/0.4)$ $\epsilon(x)=(0.0200326x+0.0026174x^2)/a_0$ $a_0=0.543$ nm ($a_0$ is the lattice constant of Si).

Next, a second SiGe layer 3 is epitaxially grown on first SiGe layer 2. The Ge composition ratio y of this second SiGe layer 3 is set to be at least lower than intralayer maximum value of Ge composition ratio x in the first SiGe layer 2 at the contact surface with the first SiGe layer 2. In addition, the second SiGe layer 3 is an incremental composition layer in which its Ge composition ratio y gradually increases towards the surface (e.g., a layer in which Ge composition ratio y increases from 0 to 0.3) (incremental composition region), and is deposited to a thickness of, for example, 1.1 µm.

When epitaxial growth of second SiGe layer 3 is started, since strain energy is already accumulated in first SiGe layer 2, generation of dislocation and growth begin from the interfaces on both sides of first SiGe layer 2 and from the side of first SiGe layer 2 in second SiGe layer 3, and lattice relaxation of first SiGe layer 2 and second SiGe layer 3 begins at the stage the film thickness of second SiGe layer 3 is thin. At this time, since the Ge composition ratio of the second SiGe layer 3 is lower than the intralayer maximum value of the Ge composition ratio in the first SiGe layer 2 at the contact surface with the first SiGe layer 2, dislocation occurs concentrated along interfaces 2a and 2b on both sides of first SiGe layer 2, and the generation of dislocation in interfaces 2a and 2b on both sides of first SiGe layer 2 assists the lattice relaxation of second SiGe layer 3, which together with inhibiting generation of dislocation and growth within second SiGe layer 3, also inhibits worsening of surface roughness of the surface of second SiGe layer 3.

Moreover, the semiconductor wafer W of the present embodiment is produced by epitaxially growing an SiGe relaxation layer 4 having a constant composition ratio, in which Ge composition ratio z is the same as the final Ge composition ratio of the second SiGe layer 3 (e.g., z=0.3), to a predetermined thickness (e.g., 0.75 µm), epitaxially growing single crystal Si on the SiGe relaxation layer 4, and then forming strained Si layer 5 to a predetermined thickness (e.g., 20 nm).

Furthermore, the aforementioned deposition by vacuum CVD uses $H_2$ for the carrier gas and $SiH_4$ and $GeH_4$ for the source gases.

In this type of semiconductor wafer W of the present embodiment, since the film thickness of the first SiGe layer 2 is set to be thinner than the film thickness at which remarkable generation of dislocation and lattice relaxation actually begin, and the Ge composition ratio y of the second SiGe layer 3 is made to at least be lower than the intralayer maximum value of Ge composition ratio x in the first SiGe layer 2 at the contact surface with the first SiGe layer 2, dislocation can be efficiently concentrated in interface 2a between Si substrate 1 and first SiGe layer 2 and interface 2b between first SiGe layer 2 and second SiGe layer 3, thereby making it possible to reduce penetrating dislocation density and surface roughness.

In addition, since the Ge composition ratio of the first SiGe layer 2 is constant, the film thickness at which remarkable generation of dislocation and lattice relaxation actually begin becomes the thinnest at the same Ge composition ratio, thereby offering the advantage of a short time required for deposition since the effects of the present invention are obtained at the thinnest film thickness.

In addition, as a result of making first SiGe layer 2 have a thickness that is less than twice the critical thickness $t_c$ that satisfies the aforementioned relational expression, the film thickness of the first SiGe layer 2 can be easily set to be within the film thickness at which remarkable generation of dislocation and lattice relaxation actually begin based on experimental results to be described later.

In addition, in the present embodiment, as a result of the second SiGe layer 3 being in the form of an incremental composition layer (incremental composition region) in which the Ge composition ratio is gradually increased, dislocation is generated uniformly, interaction between dislocations occurs, and together with reducing dislocation density within the second SiGe layer 3, since the growth of dislocation is induced in the lateral direction, penetrating dislocation density in the surface region decreases, thereby demonstrating the effect of inhibiting worsening of surface roughness.

In addition, in the present embodiment, since strain energy is already accumulated in the first SiGe layer 2 prior to deposition of the second SiGe layer 3, the aforementioned effects are obtained throughout the entire incremental composition region within second SiGe layer 3 since generation of dislocation begins within the second SiGe layer 3, penetrating dislocation density in the surface region of second SiGe layer 3 decreases and worsening of surface roughness is inhibited.

Moreover, first SiGe layer 2 functions as a layer that removes moisture, oxygen components, carbon components and other impurities on the surface of Si substrate 1, and has the effect of inhibiting defects caused by surface contamination of Si substrate 1.

Next, an explanation is provided of a field effect transistor (MOSFET) that uses the aforementioned semiconductor wafer W of the present invention along with its manufacturing process with reference to FIG. 3.

FIG. 3 shows the schematic structure of a field effect transistor of the present invention. In producing this field effect transistor, an $SiO_2$ gate oxide film 6 and a gate polysilicon film 7 are sequentially deposited on a strained Si layer 5 on the surface of semiconductor wafer W produced with the aforementioned manufacturing process. A gate electrode (not shown) is formed by patterning on gate polysilicon film 7 on the portion to serve as a channel region.

Next, gate oxide film 6 is also patterned to remove the portion other than that beneath the gate electrode. Moreover, an n-type or p-type source region S and a drain region D are formed in a self-matching manner on strained Si layer 5 and relaxation layer 4 by ion injection using the gate electrode as a mask. Subsequently, a source electrode and drain electrode (not shown) are respectively formed on source region S and drain region D to produce an n-type or p-type MOSFET in which strained Si layer 5 serves as the channel region.

In a MOSFET produced in this manner, since a channel region is formed on strained Si layer 5 on a semiconductor wafer W produced with the aforementioned manufacturing method, a MOSFET offering even better characteristics can be obtained at high yield on a high-quality strained Si layer 5.

Figure 4:
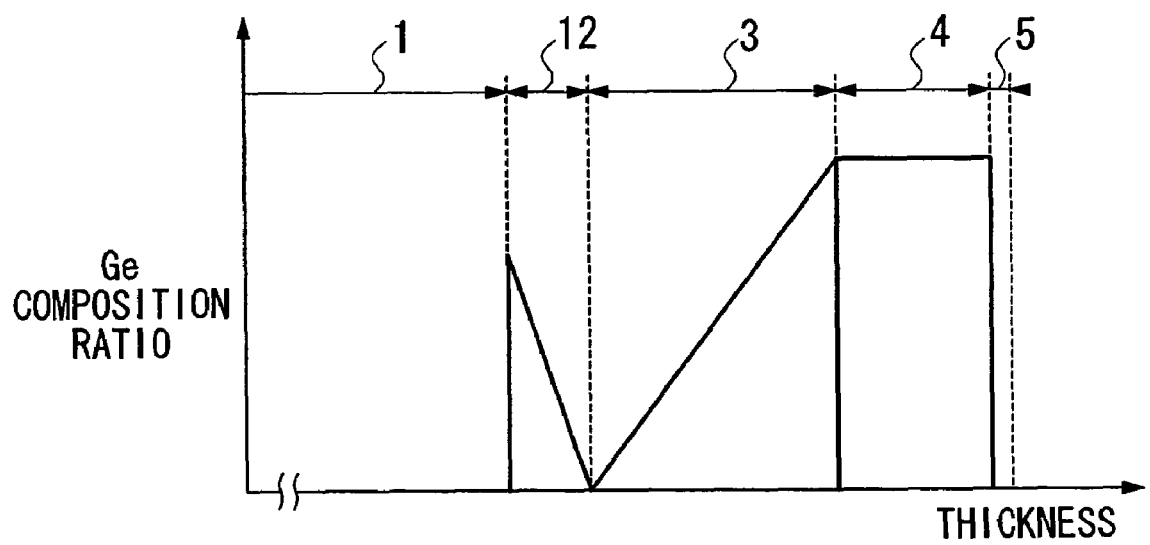
FIG. 4 is a graph showing the Ge composition ratio versus film thickness of a semiconductor substrate in a second embodiment as claimed in the present invention.

Next, an explanation is provided of a second embodiment as claimed in the present invention with reference to FIG. 4.

The difference between the second embodiment and the first embodiment is that, in contrast to the Ge composition ratio being set to be constant in the first SiGe layer 2 in the first embodiment, in the second embodiment, Ge composition ratio x of a first SiGe layer 12 is made to be the intralayer maximum value at the contact surface with Si substrate 1, and Ge composition ratio x is gradually decreased as shown in FIG. 4.

Namely, in the present embodiment, in the formation step of first SiGe layer 12, Ge composition ratio x is made to be 0.2 at the start of deposition, after which it is gradually decreased until ultimately Ge composition ratio x changes to nearly zero, resulting in an incremental composition layer that is only grown to a predetermined thickness that is thinner than the film thickness at which remarkable generation of dislocation and lattice relaxation actually begins (e.g., 350 nm).

In the present embodiment, by making the Ge composition ratio x of the first SiGe layer 12 the intralayer maximum value at the contact surface with Si substrate 1, strain energy during deposition is concentrated on the side of the interface with Si substrate 1, and during lattice relaxation that occurs at the start of deposition of second SiGe layer 3, greater dislocation is generated at the interface with Si substrate 1 than at the interface with second SiGe layer 3. As a result, dislocation can be concentrated at a location away from the surface of second SiGe layer 3, thereby making it possible to reduce penetrating dislocation and surface roughness in the same manner as the first embodiment.

Figure 5:
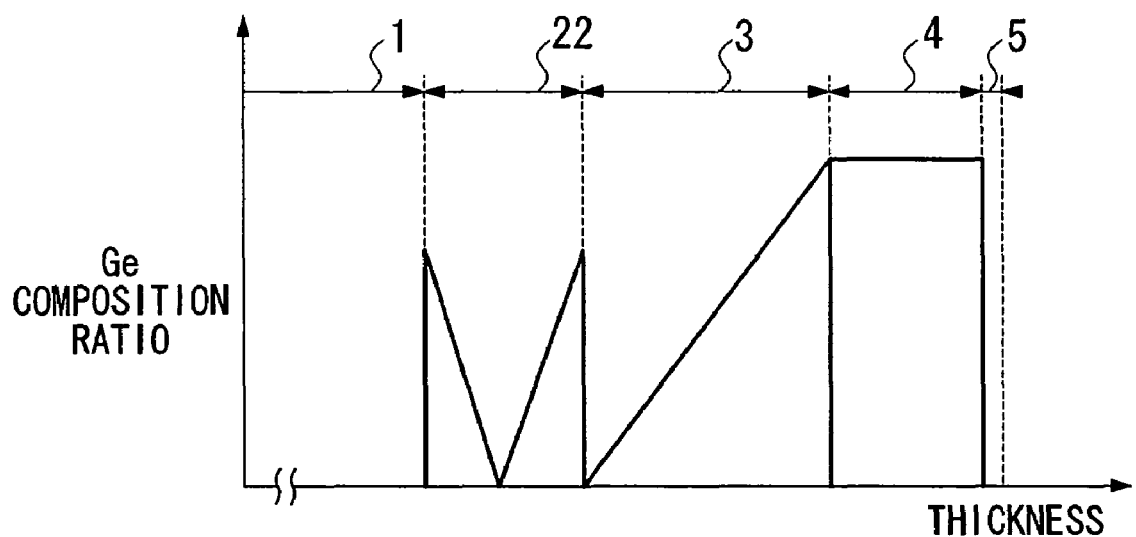
FIG. 5 is a graph showing the Ge composition ratio versus film thickness of a semiconductor substrate in a third embodiment as claimed in the present invention.

Next, an explanation is provided of a third embodiment as claimed in the present invention with reference to FIG. 5.

The difference between the third embodiment and second embodiment is that, in contrast to the second SiGe layer 12 of the second embodiment being an incremental composition layer in which the Ge composition ratio is gradually increased, in the third embodiment, in the formation step of first SiGe layer 22 as shown in FIG. 5, first SiGe layer 22 is made to be in the form of a variable composition layer that is deposited to a predetermined thickness (e.g., 175 nm) by making the Ge composition ratio x at the start of deposition 0.2, and after depositing to a predetermined thickness (e.g., 175 nm) by subsequently gradually decreasing Ge composition ratio x and changing it to nearly zero, the Ge composition ratio x is then again gradually increased, finally reaching a Ge composition ratio x of 0.2.

Furthermore, the thickness of this first SiGe layer 22 is set to be thinner than the film thickness at which remarkable generation of dislocation and lattice relaxation actually begins.

In this third embodiment as well, since the Ge composition ratio x of the first SiGe layer 22 becomes the intralayer maximum value at the contact surface with Si substrate 1 and second SiGe layer 3, similar to the first embodiment, a large amount of dislocation occurs at the interface with Si substrate 1 and second SiGe layer 3.

Figure 6:
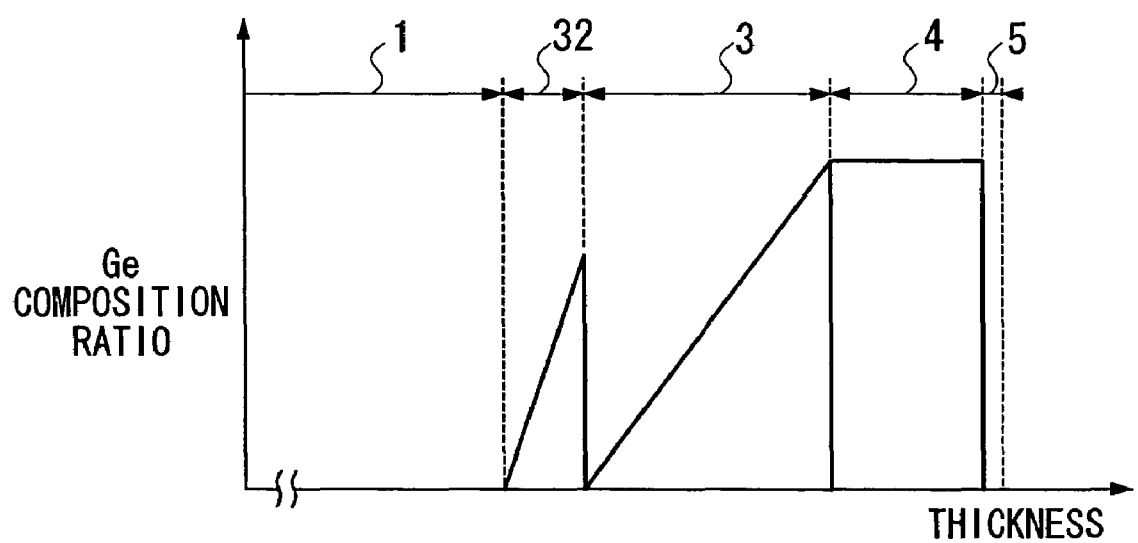
FIG. 6 is a graph showing the Ge composition ratio versus film thickness of a semiconductor substrate in a fourth embodiment as claimed in the present invention.
Figure 7:
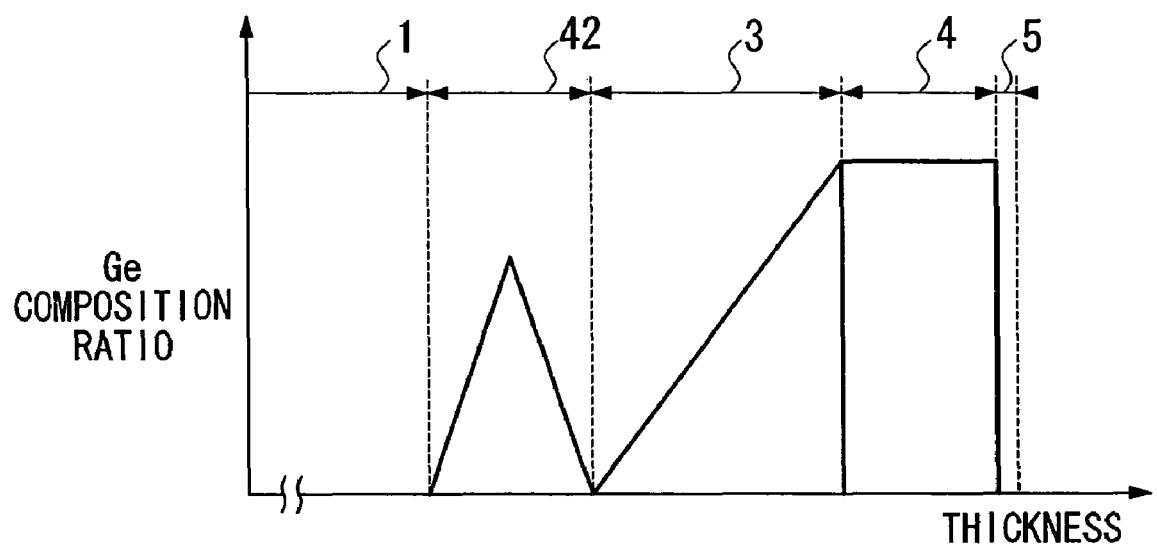
FIG. 7 is a graph showing the Ge composition ratio versus film thickness of a semiconductor substrate in a fifth embodiment as claimed in the present invention.

Next, an explanation is provided of fourth and fifth embodiments as claimed in the present invention with reference to FIGS. 6 and 7.

The difference between the fourth embodiment and the first embodiment is that, in contrast to the Ge composition ratio being set to be constant in the first SiGe layer 2 in the first embodiment, in the fourth embodiment as shown in FIG. 6, the Ge composition ratio x of a first SiGe layer 32 is gradually increased from nearly zero to ultimately 0.2, and deposited at a predetermined thickness (e.g., 350 nm) that is thinner than the film thickness at which remarkable generation of dislocation and lattice relaxation actually begins.

In addition, the difference between the fifth embodiment and first embodiment is that, in contrast to the Ge composition ratio being set to be constant in the first SiGe layer 2 in the first embodiment, in the fifth embodiment as shown in FIG. 7, the Ge composition ratio x of a first SiGe layer 42 is deposited at a predetermined thickness (e.g., 175 nm) while gradually increasing from nearly zero to 0.2, and then subsequently deposited at a predetermined thickness (e.g., 175 nm) while gradually decreasing Ge composition ratio x from 0.2 to nearly zero. Furthermore, the thickness of first SiGe layer 42 is set to be thinner than the film thickness at which remarkable generation of dislocation and lattice relaxation actually begin.

In these fourth and fifth embodiments, since both first SiGe layers 32 and 42 are formed at a film thickness that is thinner than the film thickness at which remarkable generation of dislocation and lattice relaxation actually begin, dislocation occurs concentrated at the interfaces on both sides of first SiGe layers 32 and 42 during deposition of second SiGe layer 3, thereby making it possible to reduce penetrating dislocation and surface roughness. Furthermore, in the fourth and fifth embodiments, since the maximum value of the Ge composition ratio in first SiGe layers 32 and 42 is not on the side of the interface with Si substrate 1, greater improvement effects on penetrating dislocation and surface roughness can be obtained than in the first and second embodiments.

Furthermore, the technical scope of the present invention is not limited to the aforementioned embodiments, but rather various modifications can be added within a range that does not deviate from the gist of the present invention.

For example, although five types of distributions were used in each of the aforementioned embodiments for the distribution of the Ge composition ratio versus film thickness in the first SiGe layer, other types of distribution may also be employed. For example, the first SiGe layer may be in the form of a multilayer film composed of a plurality of SiGe layers having different Ge composition ratios. In addition, the aforementioned multilayer film may also contain an Si layer.

In addition, although the composition was changed at a constant ratio relative to film thickness in the case of having changed the Ge composition ratio in the first SiGe layer in each of the aforementioned embodiments, a structure may also be employed in which that ratio is not constant.

Moreover, the first SiGe layer is only required to be a layer that contains Ge and accumulates strain energy, and other distributions of Ge composition ratios may also be employed.

In addition, although an incremental composition layer in which the Ge composition ratio is gradually increased was employed for the entire second SiGe layer in each of the aforementioned embodiments, it may also be in the form of a layer having a multilayer structure composed of incremental composition layers and uniform composition layers. In addition, it may also be in the form of a multilayer film containing an Si layer.

In addition, although the composition of an incremental composition region, in which the Ge composition ratio is gradually increased towards the surface in the second SiGe layer, was changed at a constant ratio relative to film thickness in each of the aforementioned embodiments, a structure may also be employed in which that ratio is not constant. In addition, the Ge composition ratio of the that incremental composition region may also be changed in steps.

In addition, although the second SiGe layer was arranged directly on the first SiGe layer in each of the aforementioned embodiments, the second SiGe layer may be arranged on the first SiGe layer with an Si layer in between.

In addition, an additional SiGe layer may be arranged on the strained Si layer of the semiconductor wafer W of each embodiment.

In addition, although a semiconductor wafer having an SiGe layer was produced as a MOSFET substrate in each of the aforementioned embodiments, the substrate may be applied to other applications as well. For example, the semiconductor substrate and semiconductor substrate manufacturing method of the present invention may also be applied to a substrate for a solar cell. Namely, a solar cell substrate may be produced by depositing an SiGe layer of an incremental composition layer, in which the Ge composition ratio is gradually increased to 100% Ge at the uppermost surface, on an Si substrate of each of the aforementioned embodiments, followed by depositing GeAs (gallium arsenide) thereon. In this case, a solar cell substrate is obtained having superior characteristics and low dislocation density.

In addition, according to the semiconductor substrate manufacturing method as claimed in the present invention, a semiconductor substrate can be obtained having an SOI (silicon on insulator) structure having strained silicon, high quality and a low level of dislocation. A semiconductor substrate employing an SOI structure having strained silicon can be produced by the so-called smart cut method. The smart cut method is also referred to as the hydrogen injection delamination method, and is a method for cutting away a thin film by using a phenomenon in which a silicon single crystal lattice is partially severed as a result of injecting hydrogen ions, and particularly protons, into silicon single crystal. A semiconductor substrate of the present application having an SOI structure in the form of SiGe/SiO2/Si produced in this manner can be preferably used in the production of an SOI substrate like that described in, for example, U.S. Pat. No. 5,906,951.

Next, an explanation is provided of the analysis results of a semiconductor substrate as claimed in the present invention as determined by SIMS (Secondary Ion Mass Spectrometry) at the time of actual production, and the results of observing penetrating dislocation density, surface roughness and surface electron micrographs.

The semiconductor substrates that were produced correspond to the aforementioned first embodiment in that, the Ge composition ratios of first SiGe layer 2 were made to be 0.1, 0.15 or 0.2, and a plurality of substrates were produced while changing film thickness. Furthermore, a substrate of the prior art, namely one not provided with a first SiGe layer, was also produced for the sake of comparison.

Figure 8:
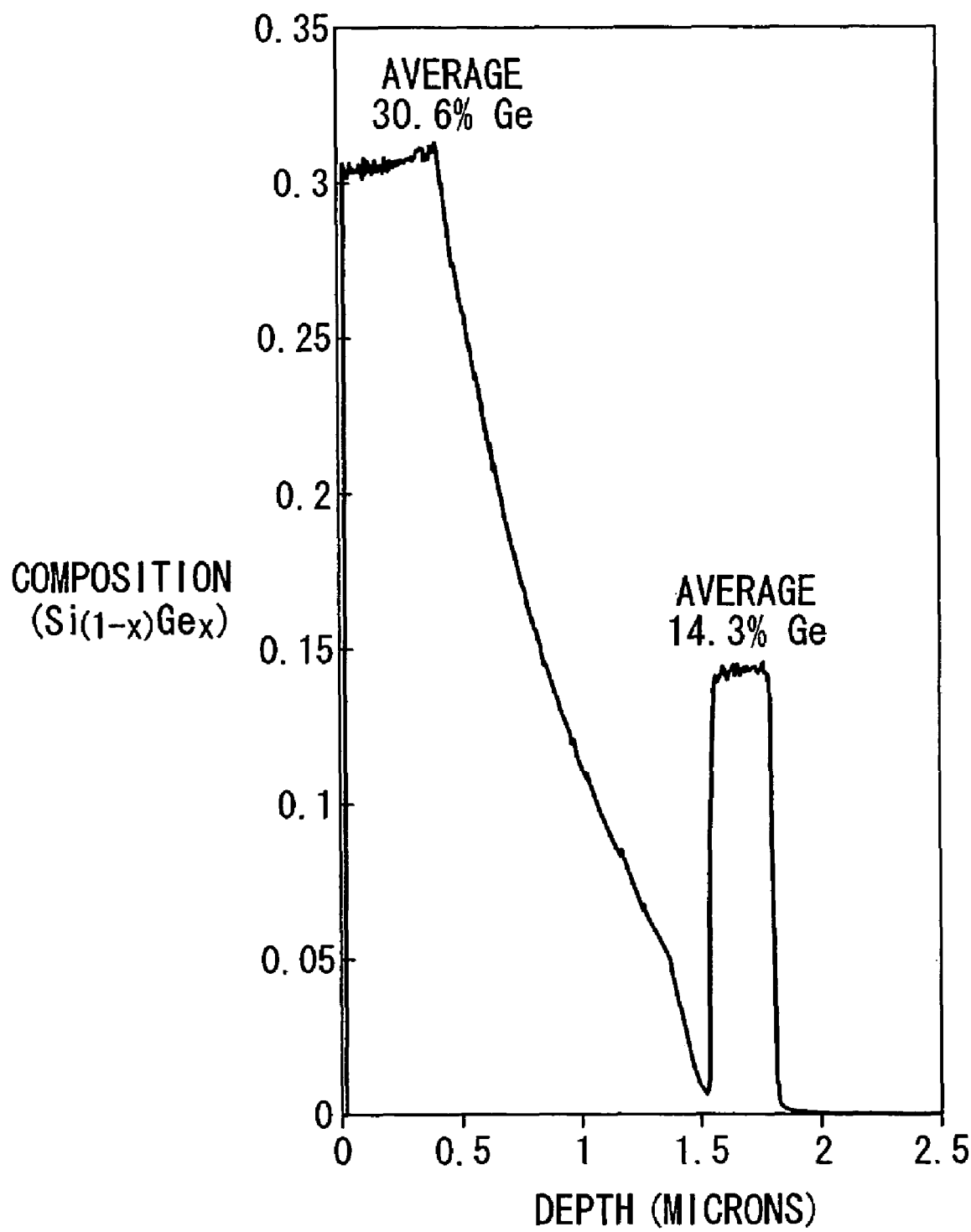
FIG. 8 is a graph showing the results of SIMS analysis of the distribution of Ge composition ratio versus film thickness for semiconductor substrates in an embodiment corresponding to a first embodiment as claimed in the present invention in which the film thickness of a first SiGe layer is made to be 300 nm.

Among these semiconductor substrates, the results of analyzing the distribution of Ge composition ratio versus film thickness by SIMS for substrates in which the film thickness of the first SiGe layer 2 is made to be 300 nm are shown in FIG. 8.

Figure 9:
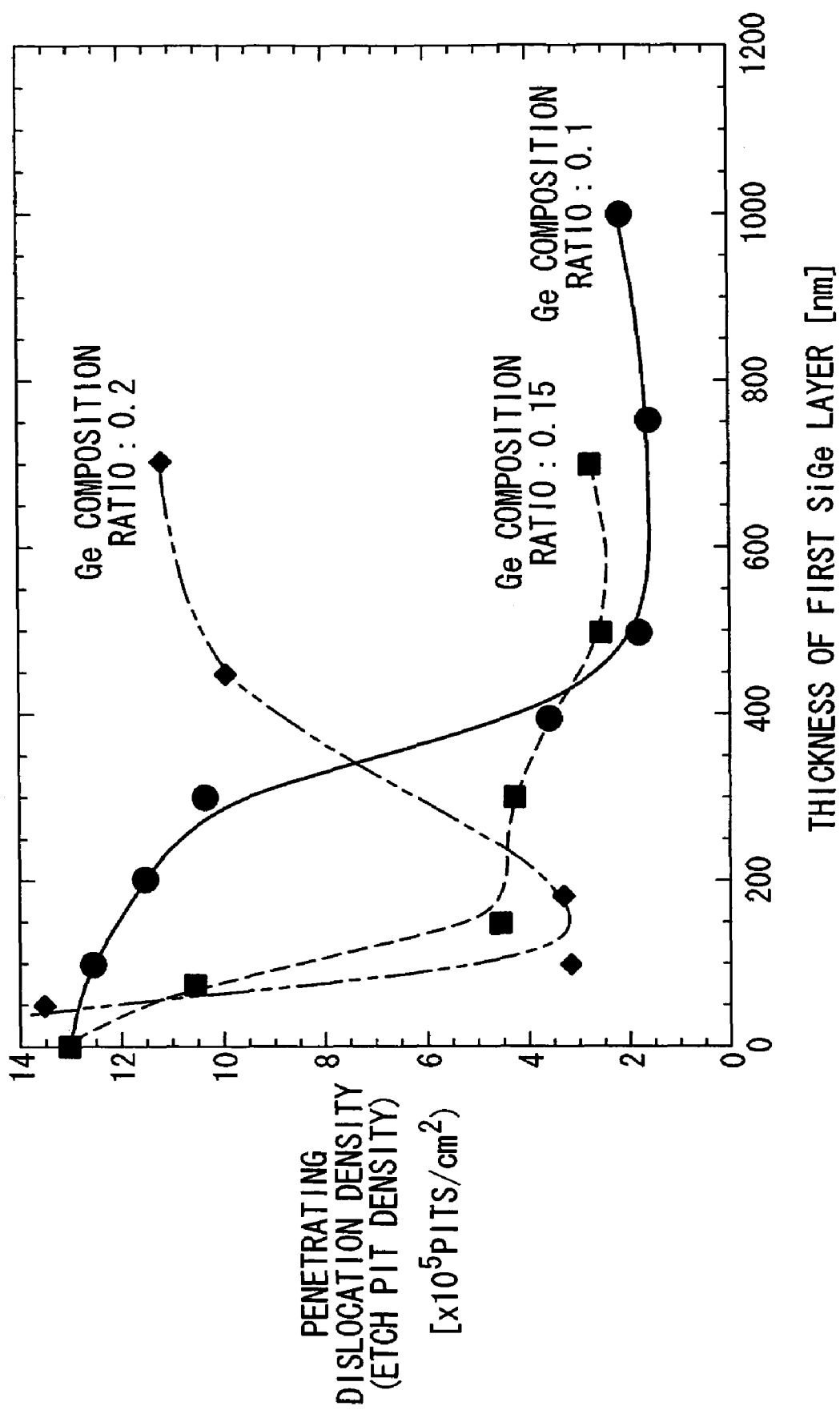
FIG. 9 is a graph showing the penetrating dislocation density versus film thickness of a first SiGe layer in an embodiment corresponding to a first embodiment as claimed in the present invention.
Figure 10:
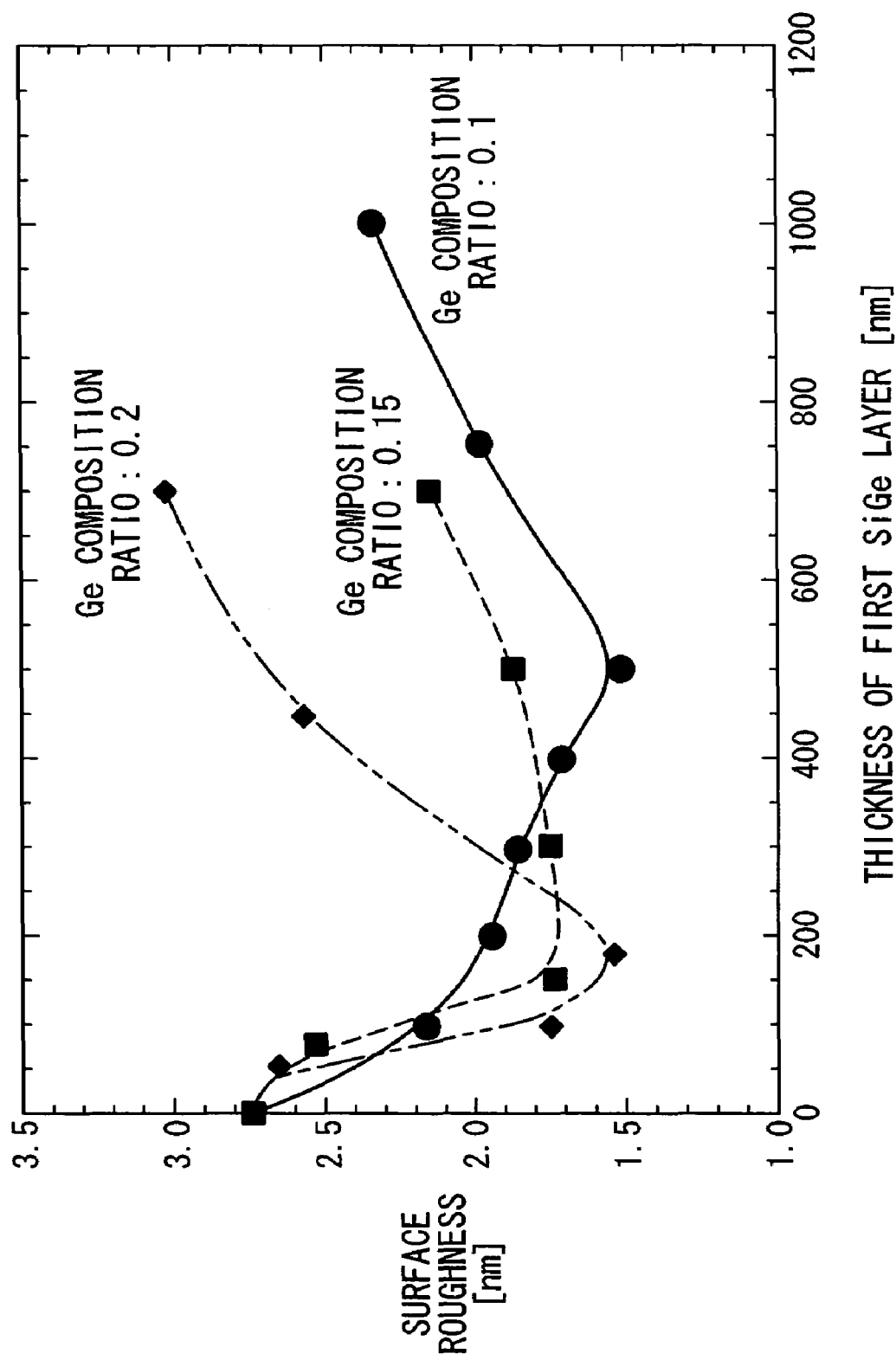
FIG. 10 is a graph showing the surface roughness versus film thickness of a first SiGe layer in an embodiment corresponding to a first embodiment as claimed in the present invention.

The results of measuring the penetrating dislocation density and surface roughness of these semiconductor substrates are shown in FIGS. 9 and 10, respectively. Furthermore, penetrating dislocation density is represented with etch pit density, while surface roughness is represented with RMS (root mean square).

As can be understood from these graphs, in comparison with the case of the prior art (thickness of first SiGe layer: 0), both penetrating dislocation density and surface roughness are decreased when the film thickness of the first SiGe layer is at least less than twice the critical film thickness $t_c$.

Figure 11:
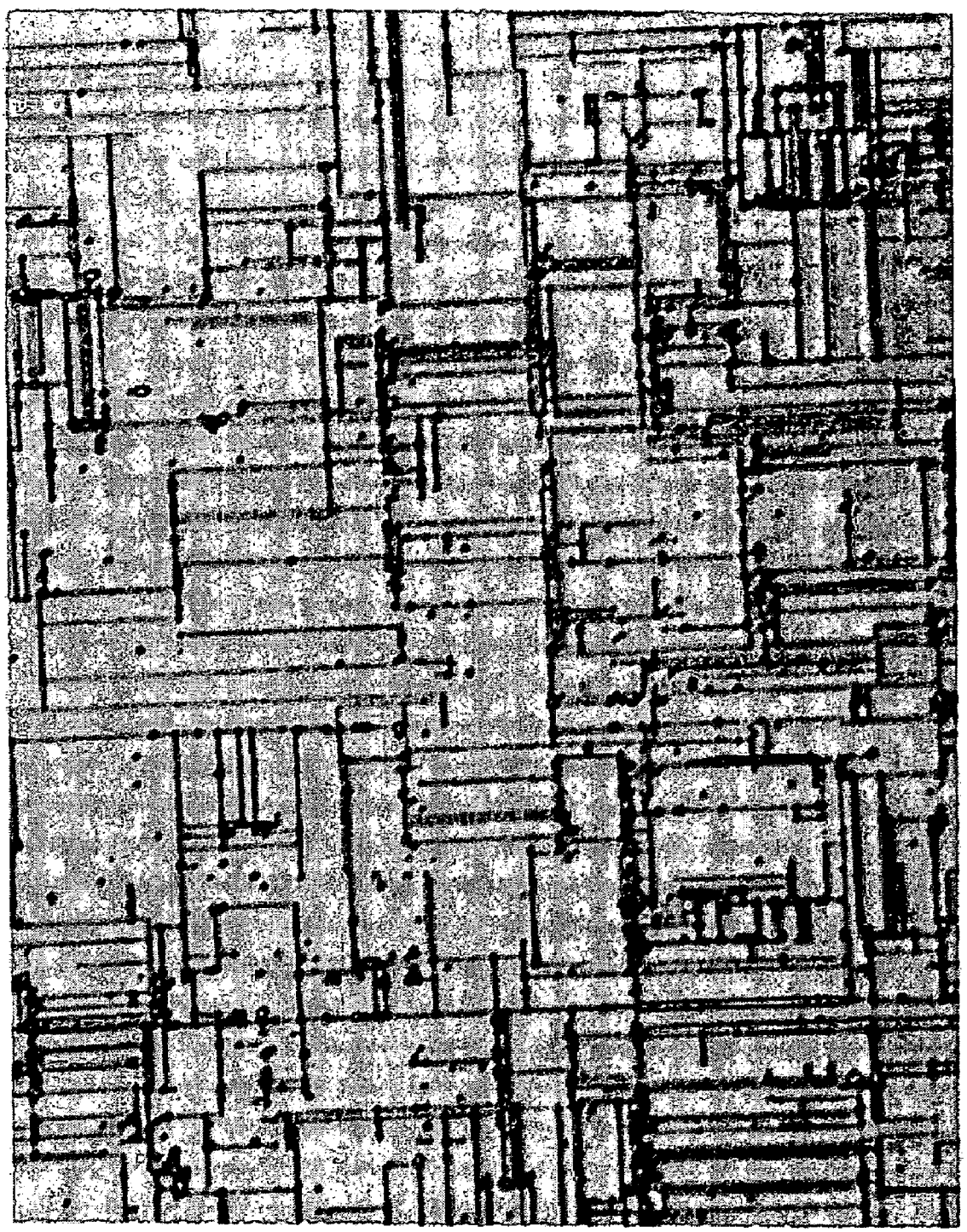
FIG. 11 is an electron micrograph of the surface in an example of the prior art relating to the present invention.
Figure 12:
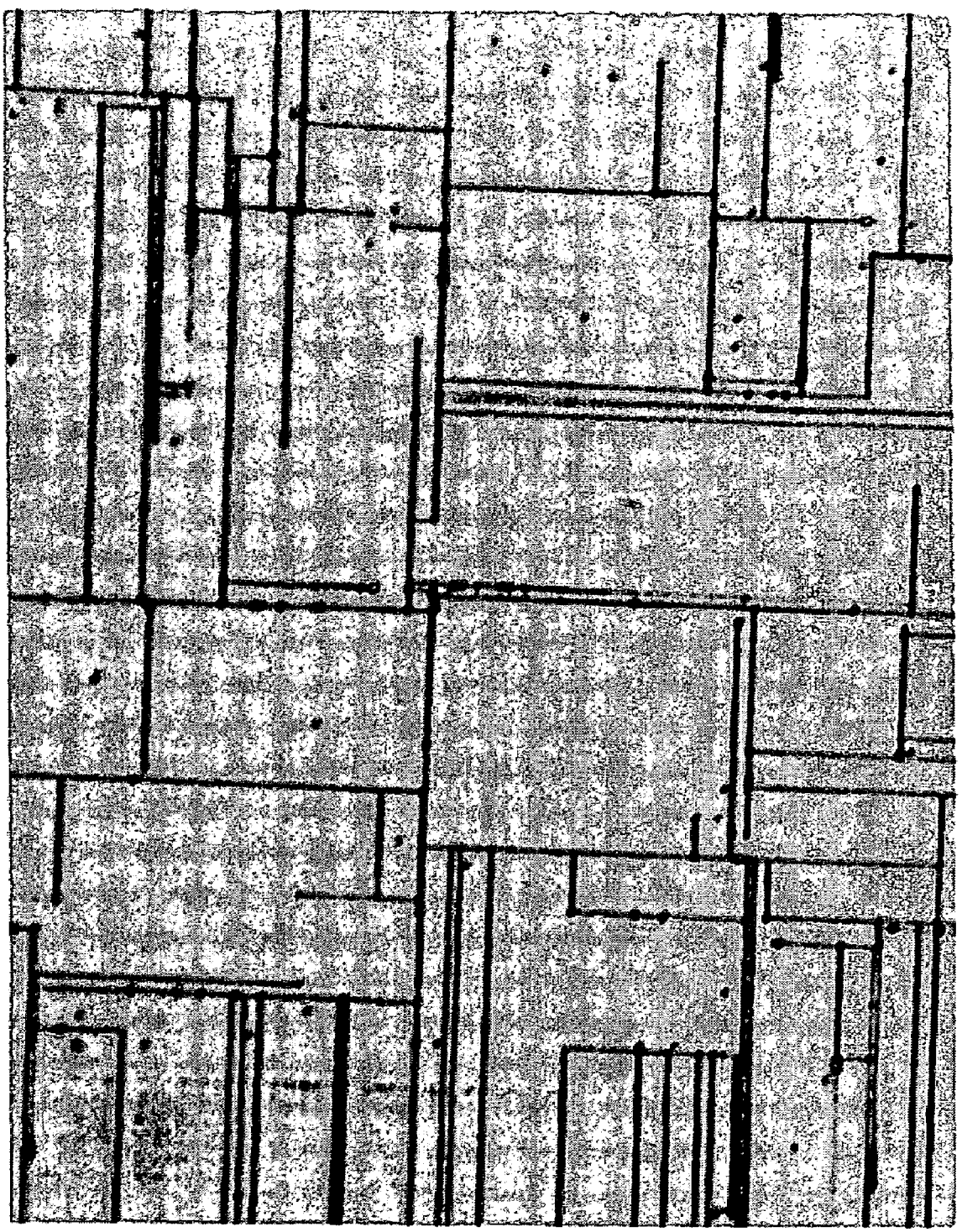
FIG. 12 is an electron micrograph of the surface in an embodiment corresponding to a first embodiment as claimed in the present invention.

In addition, surface electron micrographs in the case of the prior art (thickness of first SiGe layer: 0) and the case of the aforementioned embodiments in which the Ge composition ratio of the first SiGe layer is 0.2 and the thickness of the first SiGe layer is 180 nm are shown in FIGS. 11 and 12, respectively.

As can be understood from these micrographs, there are very few dark points corresponding to etching pits in the case of the present embodiment as compared with the case of the prior art.

Figure 24A:
FIGS. 24A to 24G are photographs of the result of observing a deposition process with a transmission electron microscope (TEM).
Figure 24B:
Figure 24C:
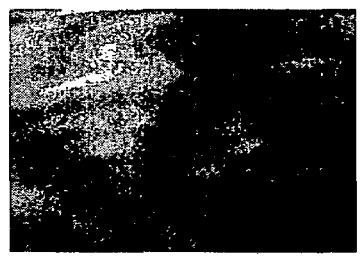
Figure 24D:
Figure 24E:
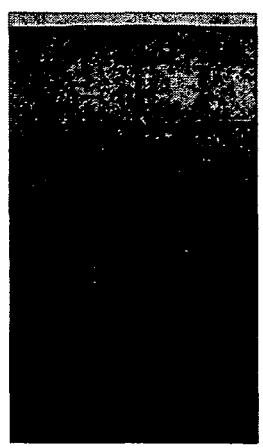
Figure 24F:
Figure 24G:

Furthermore, electron micrographs of the results of observing the course of deposition with a transmission electron microscope (TEM) are shown for the embodiments of the present invention in FIGS. 24A through 24G. FIGS. 24A through 24C show micrographs of the course of deposition by a manufacturing method of the prior art, while FIGS. 24D through 24D show the course of deposition by the semiconductor substrate manufacturing method of the present application. FIGS. 24B and 24E are micrographic taken at the same point in time, while FIGS. 24C and 24F are micrographs taken at the same point in time earlier during the course of deposition. In FIG. 24C, relaxation has not yet begun. In contrast, according to FIG. 24F, consideration dislocation has occurred at the interface between the first SiGe layer, and there can be confirmed to be very little dislocation on the surface side of the second SiGe layer, and relaxation can be confirmed to already be proceeding at both interfaces of the first SiGe layer.

Figure 14:
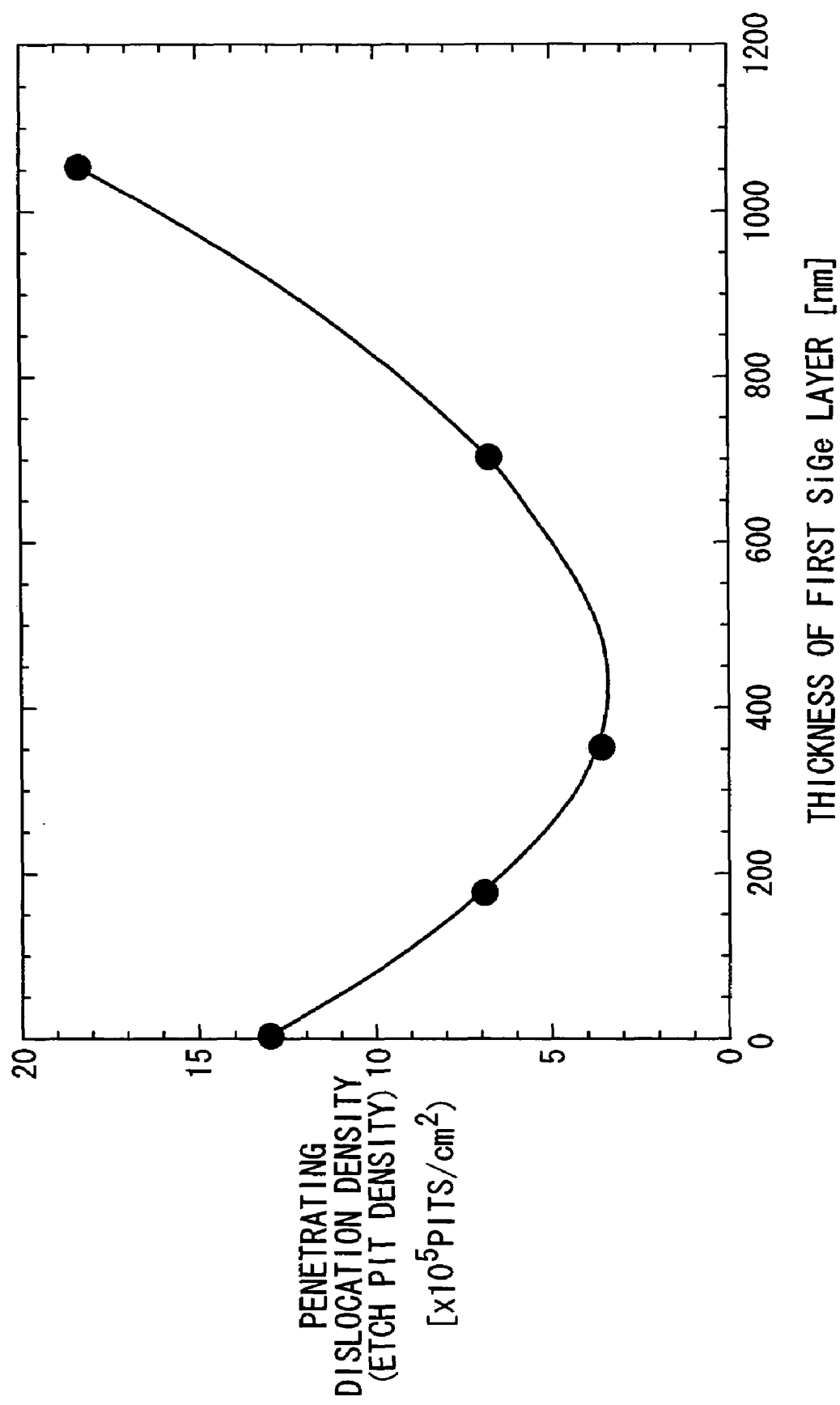
FIG. 14 is a graph showing the results of measuring penetrating dislocation density versus film thickness of a first SiGe layer in an embodiment corresponding to a second embodiment as claimed in the present invention.
Figure 15:
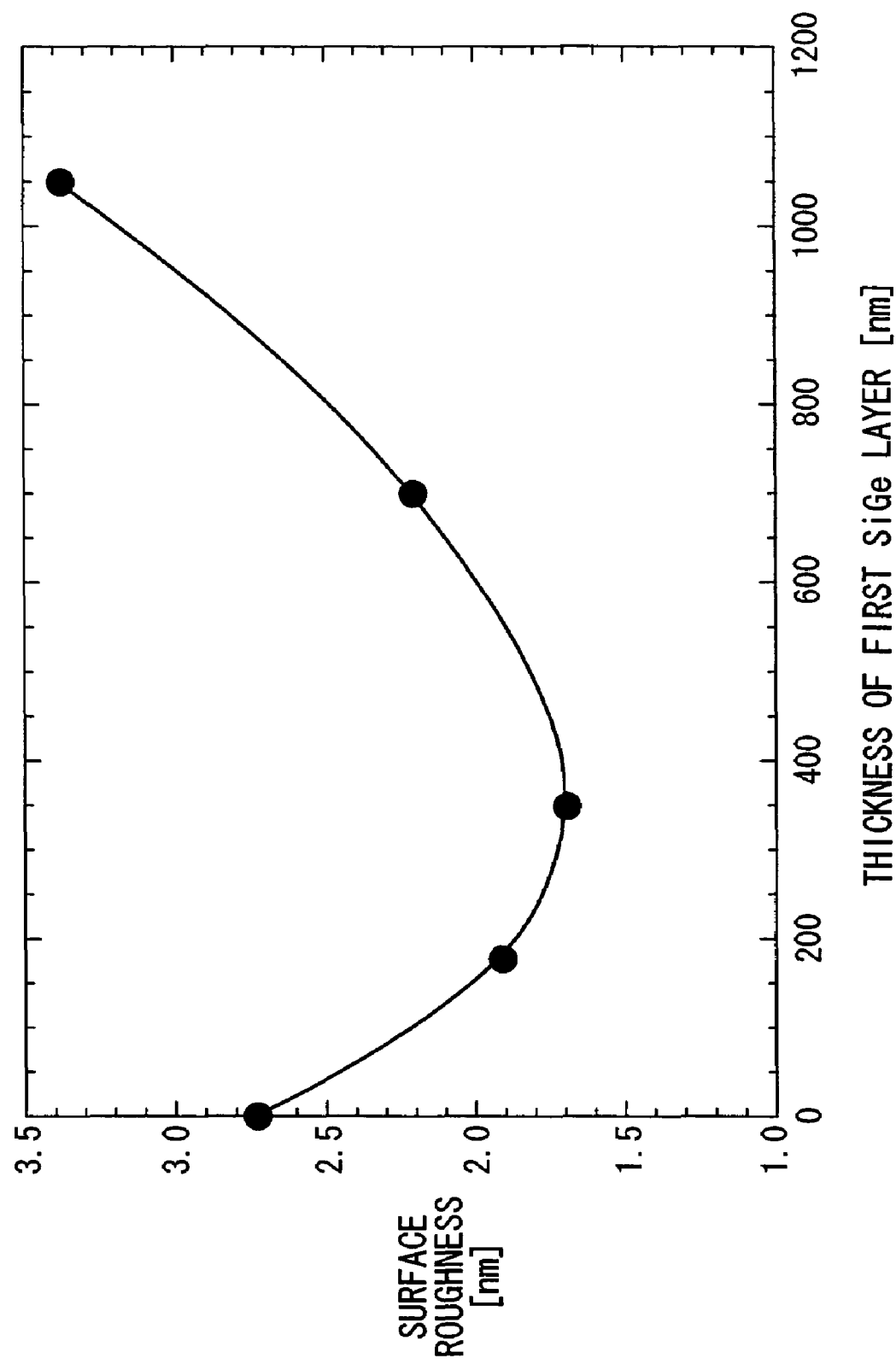
FIG. 15 is a graph showing the results of measuring the surface roughness versus film thickness of first SiGe layer in an embodiment corresponding to a second embodiment as claimed in the present invention.

In addition, the results of actually producing semiconductor substrates corresponding to the aforementioned second through fifth embodiments and measuring surface roughness in the same manner as described above are shown in FIG. 13. Furthermore, the maximum Ge composition ratio of the first SiGe layer is made to be 0.2, and the film thickness is made to be 350 nm in all cases. As can be understood from FIG. 13, in these embodiments, those embodiments corresponding to the second and third embodiments demonstrated better results than the other embodiments. The results of measuring penetrating dislocation density and surface roughness versus film thickness of the first SiGe layer for an embodiment corresponding to the second embodiment are shown in FIGS. 14 and 15, respectively. Similar to the case of the first embodiment, penetrating dislocation density and surface roughness are both decreased as compared with the case of the prior art (thickness of first SiGe layer: 0) when the film thickness of the first SiGe layer is at least less than twice the critical film thickness $t_c$.

The following provides an explanation of a sixth embodiment as claimed in the present invention with reference to FIGS. 1, 3, 16, 17 and 18.

Figure 16:
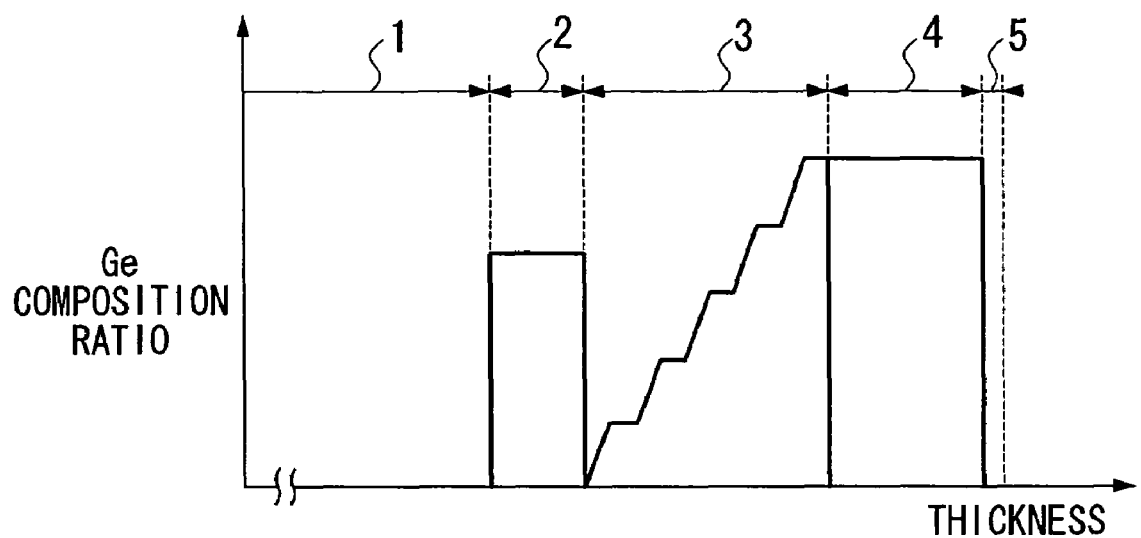
FIG. 16 is a graph showing the Ge composition ratio versus film thickness of a semiconductor substrate in a first embodiment as claimed in the present invention.

FIG. 1 shows the cross-sectional structure of a semiconductor wafer (semiconductor substrate) W of the present invention. The following provides an explanation of the structure of this semiconductor wafer along with its production process. First, as shown in FIG. 16, a first SiGe layer 2, in which the Ge composition ratio x is constant (e.g., x=0.15) and which has a thickness that is thinner than the film thickness at which remarkable generation of dislocation and lattice generation actually begins (e.g., 300 nm), is epitaxially grown by, for example, a vacuum CVD method on a p-type or n-type Si substrate 1 produced by drawing and growing using the CZ method and so forth.

At this time, since the first SiGe layer 2 is deposited thinner than the film thickness at which remarkable generation of dislocation and lattice relaxation actually begins, although strain energy increases corresponding to film thickness during deposition of first SiGe layer 2, there is hardly any occurrence of dislocation or lattice relaxation.

Furthermore, the thickness of first SiGe layer 2 is a thickness that is less than twice the critical film thickness $t_c$ which satisfies the following relational expression:

$$t_c(\text{nm})=(1.9\times10^{-3}/\epsilon(x)^2)\cdot\ln(t_c/0.4)$$

$$\epsilon(x)=(0.0200326x+0.0026174x^2)/a_0$$

$a_0$=0.543 nm ($a_0$ is the lattice constant of Si).

Next, a second SiGe layer 3 is epitaxially grown on first SiGe layer 2. The Ge composition ratio y of this second SiGe layer 3 is set to be at least lower than intralayer maximum value of Ge composition ratio x in the first SiGe layer 2 at the contact surface with the first SiGe layer 2. In addition, the second SiGe layer 3 is a stepwise increment layer of $Si_{1-x}Ge_x$ in which the Ge composition ratio x changes in steps from 0 to y (where y=0.3, for example) at an increment moving towards the direction of deposition.

Next, a relaxation layer 4 of $Si_{1-y}Ge_y$, in which the Ge composition ratio is constant, is epitaxially grown on second SiGe layer 3. Moreover, by forming a strained Si layer 5 by epitaxially growing Si on $Si_{1-y}Ge_y$ relaxation layer 4 at Ge composition ratio z (z=y in the present embodiment), a semiconductor wafer W is produced that is provided with a strained Si layer of the present embodiment. Furthermore, in the present embodiment, the thickness of the second SiGe layer 3 is, for example, 1.5 μm, that of the relaxation layer is 0.7–0.8 μm, and that of strained Si layer 5 is 15–22 nm.

Figure 17:
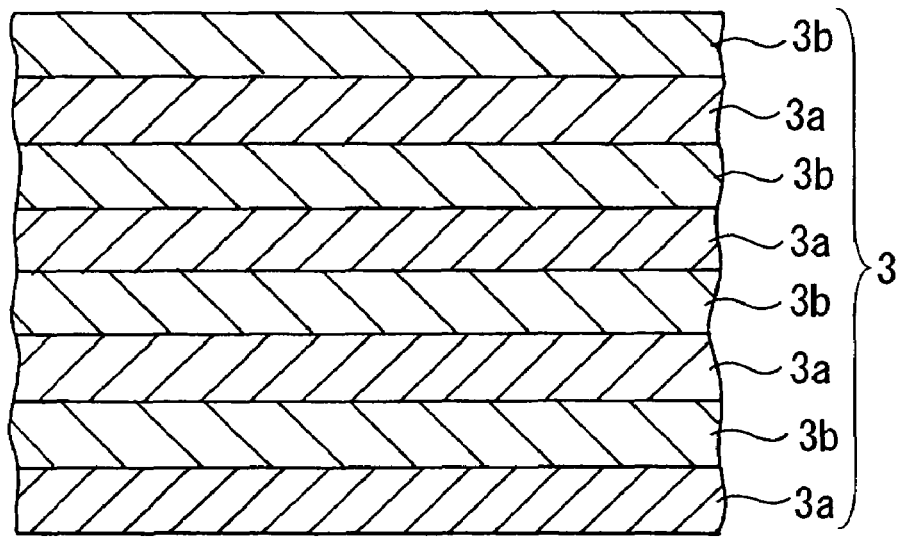
FIG. 17 is a cross-sectional view showing a second SiGe layer in a first embodiment as claimed in the present invention.
Figure 18:
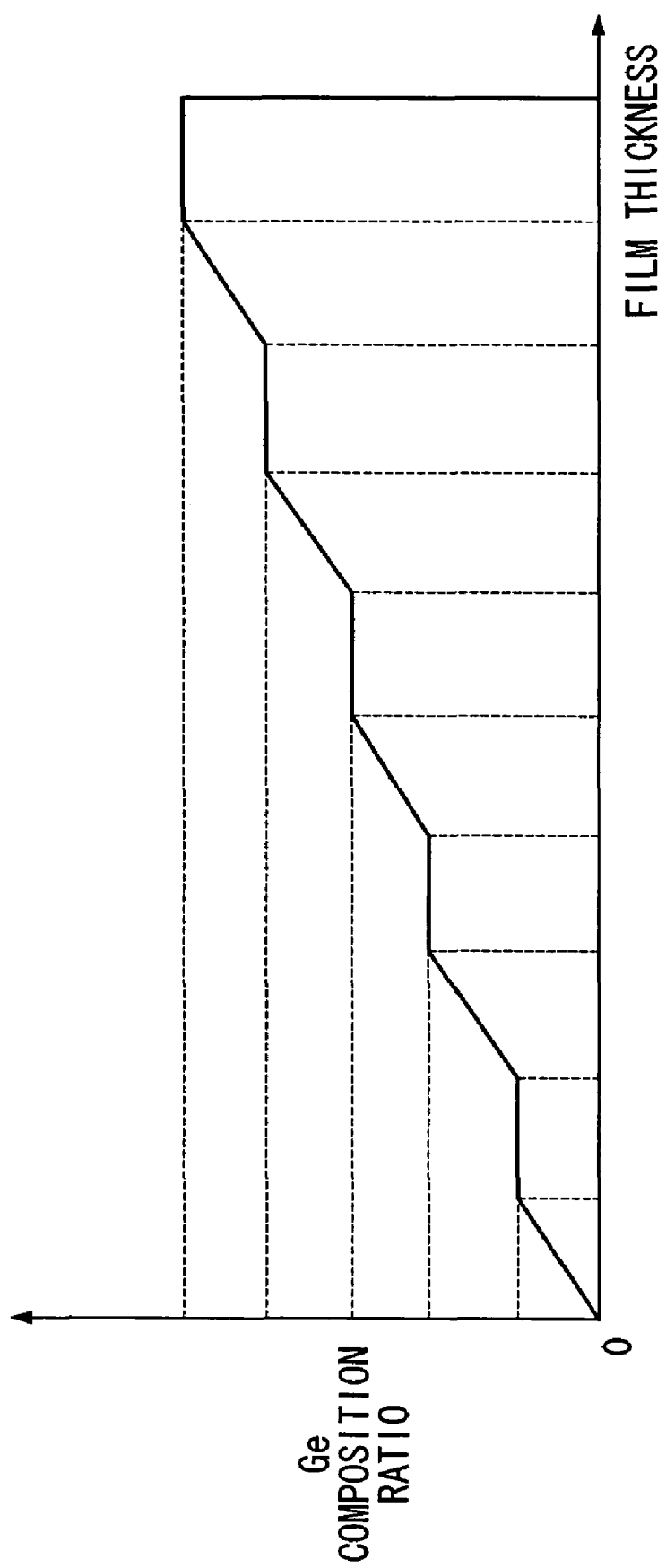
FIG. 18 is a graph showing the Ge composition ratio versus film thickness of a second SiGe layer in a first embodiment as claimed in the present invention.

As shown in FIGS. 16 through 18, deposition of the aforementioned second SiGe layer 3 is carried out by repeating a plurality of times at a constant Ge composition ratio a step in which an SiGe incremental composition layer 3a, in which the Ge composition ratio is gradually increased to a predetermined value towards the surface, is epitaxially grown, and a step in which an SiGe constant composition layer 3b is epitaxially grown on incremental composition layer 3a at the final Ge composition ratio of incremental composition layer 3a. In addition, the Ge composition ratio of the lower surface of the second SiGe layer 3 is set to be equal to or less than the Ge composite layer of the upper second SiGe layer 3 is set to be equal to or less than the Ge composite layer of the upper surface of the first SiGe layer 2. Furthermore, in the present embodiment, the Ge composition ratio of the second SiGe layer 3 is gradually increased from zero.

For example, in the present embodiment, a second SiGe layer 3 is formed by repeating the epitaxial growth steps of incremental composition layer 3a and constant composition layer 3b five times. Namely, when one round of epitaxial growth of incremental composition layer 3a and constant composition layer 3b is taken to be one step, the first step consists of growing a first incremental composition layer 3a on Si substrate 1 by gradually increasing the Ge composition ratio from 0 to 0.06, followed by forming a first constant composition layer 3b having a Ge composition ratio is 0.06 thereon. Next, the second step consists of growing a second incremental composition layer 3a on the first constant composition layer 3b having a Ge composition ratio of 0.06 by gradually increasing the Ge composition ratio from 0.06 to 0.12, followed by forming a second constant composition layer 3b having a Ge composition ratio of 0.12 thereon.

The third step consists of growing a third incremental composition layer 3a on the second constant composition layer 3b having a Ge composition ratio of 0.12 by gradually increasing the Ge composition ratio from 0.12 to 0.18, followed by forming a third constant composition layer 3b having a Ge composition ratio of 0.18 thereon. Next, the fourth step consists of growing a fourth incremental composition layer 3a on the third constant composition layer 3b having a Ge composition ratio of 0.18 by gradually increasing the Ge composition ratio from 0.18 to 0.24, followed by forming a fourth constant composition layer 3b having a Ge composition ratio of 0.24 thereon. Moreover, the final step consists of growing a fifth incremental composition layer 3a on the fourth constant composition layer 3b having a Ge composition ratio of 0.24 by gradually increasing the Ge composition ratio from 0.24 to 0.3, followed by forming a fifth constant composition layer 3b having a Ge composition ratio of 0.3 thereon. Furthermore, in the present embodiment, the film thicknesses of each incremental composition layer 3a and each constant composition layer 3b are set to be the same.

Once epitaxial growth of the aforementioned second SiGe layer is begun, since strain energy is already accumulated in first SiGe layer 2, generation of dislocation and growth begin at the interfaces on both sides of first SiGe layer 2 and from first SiGe layer 2 side within second SiGe layer 3, and lattice relaxation of first SiGe layer 2 and second SiGe layer 3 begins at the stage when the film thickness of second SiGe layer 3 is still thin. At this time, since the Ge composition ratio of the second SiGe layer 3 is lower than the intralayer maximum value of the Ge composition ratio in the first SiGe layer 2 at the contact surface with the first SiGe layer 2, dislocation occurs concentrated along interfaces 2a and 2b on both sides of first SiGe layer 2, and the generation of dislocation at interfaces 2a and 2b on both sides of first SiGe layer 2 assists in lattice relaxation of second SiGe layer 3, which together with inhibiting generation of dislocation and growth within second SiGe layer 3, inhibits worsening of surface roughness of the surface of second SiGe layer 3.

Moreover, semiconductor wafer W of the present embodiment is produced by making Ge composition ratio z to be the same as the final Ge composition ratio of second SiGe layer 3 (for example, z=0.3), epitaxially growing SiGe relaxation layer 4 having a constant composition ratio to a predetermined thickness (e.g., 0.75 µm), epitaxially growing single crystal Si on the SiGe relaxation layer 4, and forming strained Si layer 5 to a predetermined thickness (e.g., 20 nm).

Furthermore, the aforementioned deposition by vacuum CVD uses $H_2$ for the carrier gas and $SiH_4$ and $GeH_4$ for the source gases.

In this type of semiconductor wafer W of the present embodiment, since the film thickness of first SiGe layer 2 is set to be thinner than the film thickness at which remarkable generation of dislocation and lattice relaxation actually begin, and the composition ratio y of the second SiGe layer 3 is at least made to be lower than the intralayer maximum value of Ge composition ratio x in the first SiGe layer 2 at the contact surface with the first SiGe layer 2, dislocation can be efficiently concentrated in interface 2a between Si substrate 1 and first SiGe layer 2 and interface 2b between first SiGe layer 2 and second SiGe layer 3, thereby making it possible to reduce penetrating dislocation density and surface roughness.

In addition, since the Ge composition ratio of the first SiGe layer is constant, the film thickness at which generation of dislocation and lattice relaxation actually begin becomes the thinnest at the same Ge composition ratio, thereby offering the advantage of a short time required for deposition since the effects of the present invention are obtained at the thinnest film thickness.

In addition, by making first SiGe layer 2 to have a thickness that is less than twice the critical film thickness $t_c$ that satisfies the aforementioned relational expression, the film thickness of the first SiGe layer 2 can be easily set to be within the film thickness at which remarkable generation of dislocation and lattice relaxation actually begin based on experimental results to be described later.

In addition, in the present embodiment, since strain energy is already accumulated in the first SiGe layer 2 prior to deposition of the second SiGe layer 3, and the generation of dislocation begins within the second SiGe layer 3 at the stage the film thickness of the second SiGe layer 3 is still thin, penetrating dislocation density in the surface region of the second SiGe layer 3 decreases and worsening of surface roughness is inhibited.

Moreover, the first SiGe layer 2 functions as a layer that removes moisture, oxygen components, carbon components and other impurities on the surface of Si substrate 1, and is effective for inhibiting defects in Si substrate 1 caused by surface contamination.

In addition, in the present embodiment, since a step in which SiGe incremental composition layer 3a is epitaxially grown by gradually increasing the Ge composition ratio towards the surface, and a step in which an SiGe constant composition layer 3b is epitaxially grown on incremental composition layer 3a at the final Ge composition ratio of incremental composition layer 3a, are repeated a plurality of times at a continuous Ge composition ratio in the formation of second SiGe layer 3, a plurality of incremental composition layers 3a and constant composition layers 3b are alternately formed resulting in a layer in which the Ge composition ratio is incremented in steps, thereby allowing the formation of an SiGe layer in which there is low dislocation density and low surface roughness as previously described.

Namely, in the present embodiment, since an SiGe layer can be deposited, which together with causing dislocation required for lattice relaxation to be generated uniformly, causes dislocation to propagate in the lateral direction as much as possible to prevent penetration to the surface, a satisfactory surface state can be obtained.

Next, an explanation is provided of a field effect transistor (MOSFET) that uses the aforementioned semiconductor wafer W of the present invention along with its production process with reference to FIG. 3.

FIG. 3 is a cross-sectional view showing the schematic structure of a field effect transistor of the present invention. In producing this field effect transistor, an $SiO_2$ gate oxide film 6 and a gate polysilicon film 7 are sequentially deposited on a strained Si layer 5 on the surface of semiconductor wafer W produced with the aforementioned production process. A gate electrode (not shown) is formed by patterning on gate polysilicon film 7 on the portion to serve as a channel region.

Next, gate oxide film 6 is also patterned to remove the portion other than that beneath the gate electrode. Moreover, an n-type or p-type source region S and a drain region D are formed in a self-matching manner on strained Si layer 5 and relaxation layer 4 by ion injection using the gate electrode as a mask. Subsequently, a source electrode and drain electrode (not shown) are respectively formed on source region S and drain region D to produce an n-type or p-type MOSFET in which strained Si layer 5 serves as the channel region.

In a MOSFET produced in this manner, since a channel region is formed on strained Si layer 5 on a semiconductor wafer W produced with the aforementioned manufacturing method, a MOSFET offering even better characteristics can be obtained at high yield on a high-quality strained Si layer 5.

Figure 19:
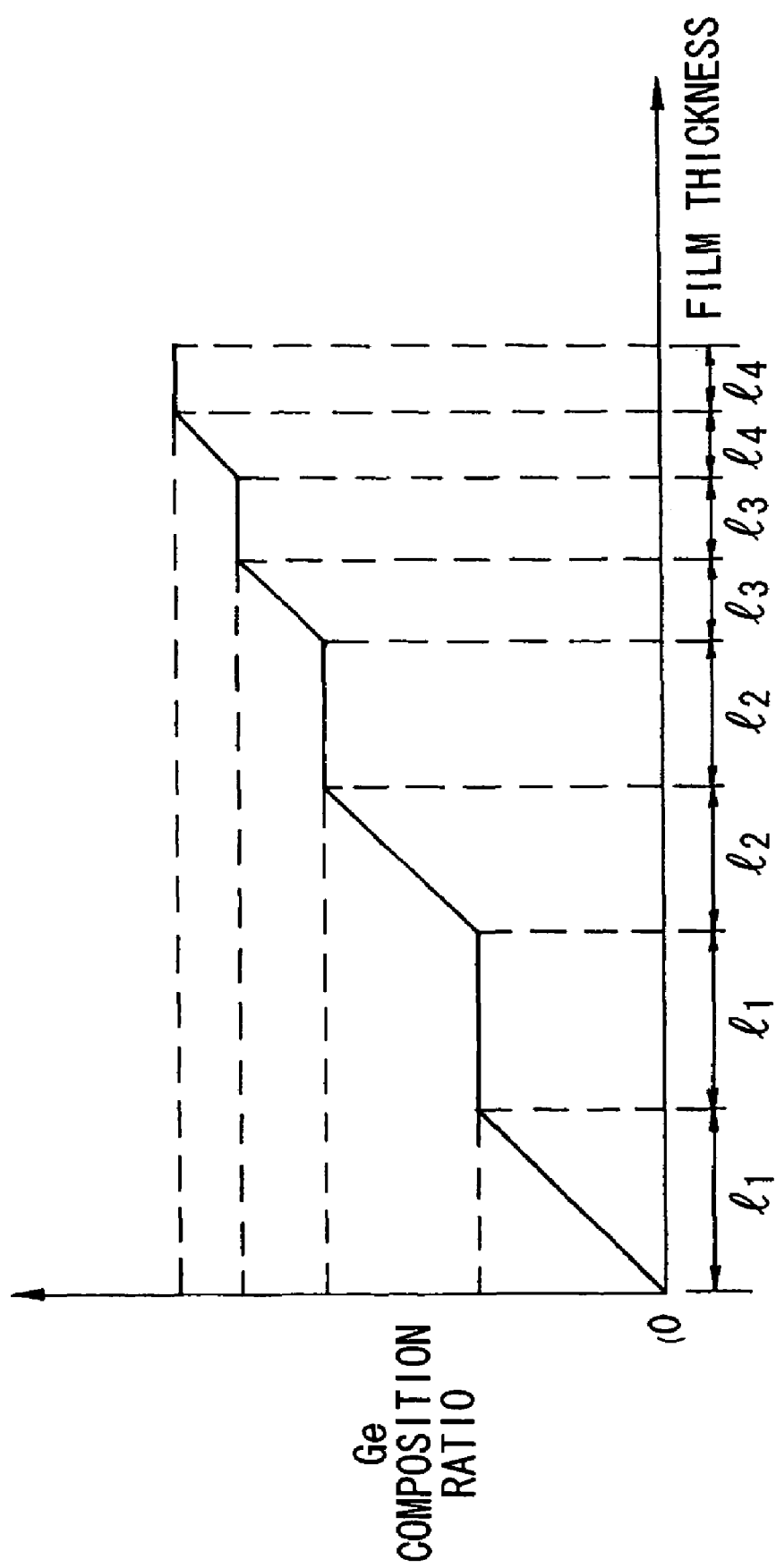
FIG. 19 is a graph showing the Ge composition ratio versus film thickness of a second SiGe layer in a second embodiment as claimed in the present invention.
Figure 20:
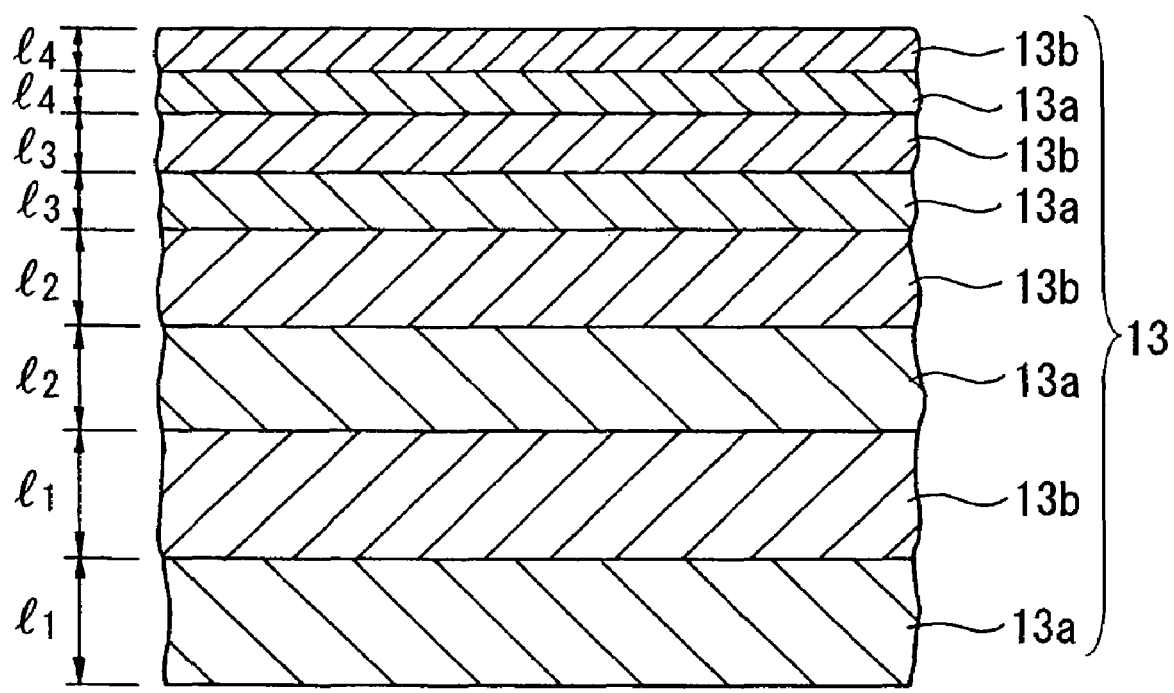
FIG. 20 is a cross-sectional view showing a second SiGe layer in a second embodiment as claimed in the present invention.

Next, an explanation is provided of a seventh embodiment as claimed in the present invention with reference to FIGS. 19 and 20.

The difference between the seventh embodiment and the sixth embodiment is that, in contrast to the film thicknesses of the incremental composition layer 3a and constant composition layer 3b in the second SiGe layer 3 in the sixth embodiment being respectively set to be the same, in the seventh embodiment, as shown in FIGS. 19 and 20, the second SiGe layer 13 is formed by gradually reducing the thicknesses of incremental composition layer 13a and constant composition layer 13b for each repetition of the step in which incremental composition layer 13a and constant composition layer 13b are epitaxially grown. Furthermore, although the epitaxial growth step of incremental composition layer 3a and constant composition layer 3b is repeated five times in the first embodiment, the present embodiment differs from this in that the second SiGe layer 13 is formed by repeating the epitaxial growth step of incremental composition layer 13a and constant composition layer 13b four times.

Namely, in the present embodiment, in the epitaxial growth step of incremental composition layer 13a and constant composition layer 13b, after growing first incremental composition layer 13a and first constant composition layer 13b, second incremental composition layer 13a and second constant composition layer 13b are grown to be thinner than first incremental composition layer 13a and first constant composition layer 13b. Moreover, third incremental composition layer 13a and third constant composition layer 13b are similarly grown to be thinner than second incremental composition layer 13a and second constant composition layer 13b, and finally fourth incremental composition layer 13a and fourth constant composition layer 13b are grown to be thinner than third incremental composition layer 13a and third constant composition layer 13b to form second SiGe layer 13.

Namely, when first incremental composition layer 13a and first constant composition layer 13b are represented with $1_1$, second incremental composition layer 13a and second constant composition layer 13b are represented with $1_2$, third incremental composition layer 13a and third constant composition layer 13b are represented with $1_3$, and fourth incremental composition layer 13a and fourth constant composition layer 13b are represented with $1_4$, then each of the layers are laminated in the manner of $1_1 \geq 1_2 \geq 1_3 \geq 1_4$.

Furthermore, although the critical film thickness at which dislocation occurs varies according to the Ge composition ratio, in each of the aforementioned layers, film thickness is set to be thicker than this critical film thickness, enabling the dislocation required for lattice relaxation to be generated uniformly in each layer.

In addition, the increment of the Ge composition ratio in each incremental composition layer 13a is set to be the same for each layer.

As was previously mentioned, since dislocation is generated more easily the higher the Ge composition ratio, in the case of repeating deposition at the same thickness as in the sixth embodiment, in contrast to more dislocation being generated the higher the layer, by gradually reducing the thickness of incremental composition layer 13a and constant composition layer 13b for each repetition as in the present embodiment, dislocation can be made to be generated uniformly in each layer.

Next, an explanation is provided of an eighth embodiment as claimed in the present invention with reference to FIGS. 21A through 21D.

Figure 21A:
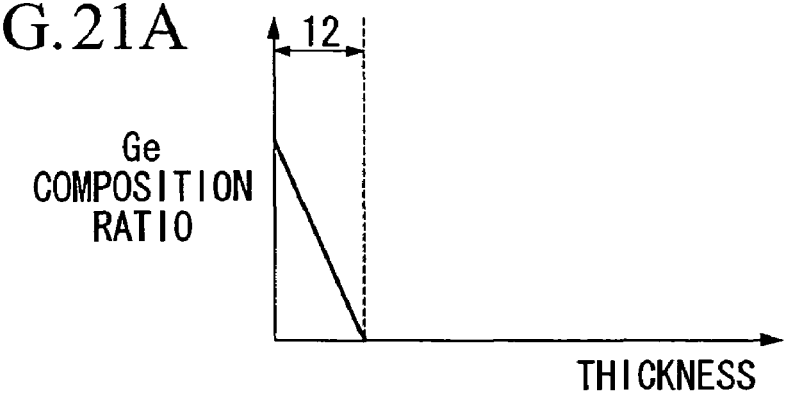
FIGS. 21A through 21D are graphs showing the Ge composition ratio versus film thickness of a first SiGe layer in respective examples of a third embodiment as claimed in the present invention.

The eighth embodiment differs from the sixth embodiment in that in contrast to the Ge composition ratio being set to be constant in the first SiGe layer 2 in the sixth embodiment, in the eighth embodiment, as shown in FIGS. 21A through 21D, the Ge composition ratio x of the first SiGe layer is not constant. For example, in a first example of the present embodiment as shown in FIG. 21A, the Ge composition ratio x of the first SiGe layer 12 reaches an intralayer maximum value at the contact surface with Si substrate 1, after which the Ge composition ratio x is gradually decreased.

Namely, in the formation step of first SiGe layer 12 in a first example of the present embodiment, the Ge composition ratio x is made to be 0.3 at the start of deposition, after which it is gradually decreased until ultimately Ge composition ratio x changes to nearly zero, resulting in an incremental composition layer that is only grown to a predetermined thickness that is thinner than the film thickness at which remarkable generation of dislocation and lattice relaxation actually begins (e.g., 350 nm).

In the present embodiment, by making the Ge composition ratio x of first SiGe layer 12 to be the intralayer maximum value at the contact surface with Si substrate 1, strain energy during deposition is concentrated at the side of the interface with Si substrate 1, there causing greater generation of dislocation at the interface with Si substrate 1 than at the interface with second SiGe layer 3 during lattice relaxation that occurs during deposition of second SiGe layer 3. As a result, dislocation can be concentrated at a location away from the surface of second SiGe layer 3, thereby making it possible to reduce penetrating dislocation and surface roughness in the same manner as the sixth embodiment.

Figure 21B:
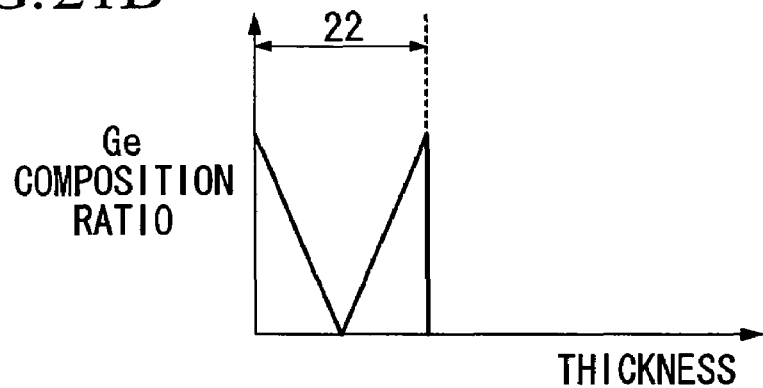

In addition, in the formation step of first SiGe layer 22 in a second example of the present embodiment as shown in FIG. 21B, first SiGe layer 22 is made to be in the form of a variable composition layer that is deposited to a predetermined thickness (e.g., 175 nm) by making the Ge composition ratio x at the start of deposition 0.2, and after depositing to a predetermined thickness (e.g., 175 nm) by subsequently gradually decreasing Ge composition ratio x and changing it to nearly zero, the Ge composition ratio x is then again gradually increased, finally reaching a Ge composition ratio x of 0.2.

Furthermore, the thickness of this first SiGe layer 22 is set to be thinner than the film thickness at which remarkable generation of dislocation and lattice relaxation actually begins.

In this second example as well, since the Ge composition ratio x of the first SiGe layer 22 becomes the intralayer maximum value at the contact surface with Si substrate 1 and second SiGe layer 3, similar to the sixth embodiment, a large amount of dislocation occurs at the interface with Si substrate 1 and second SiGe layer 3.

Figure 21C:
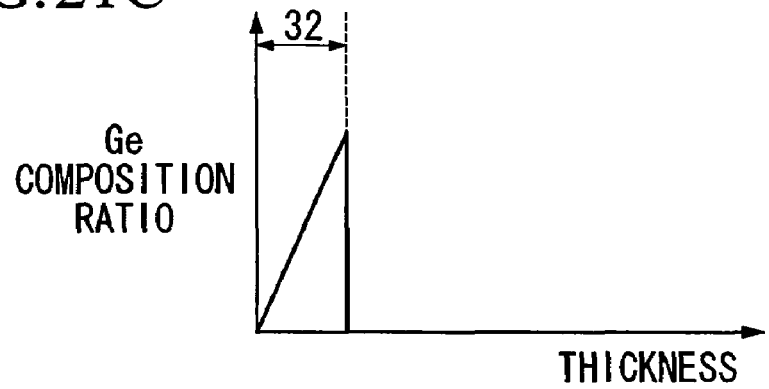

In addition, in a third example of the present embodiment as shown in FIG. 21C, the Ge composition ratio x of a first SiGe layer 32 is gradually increased from nearly zero to ultimately 0.2, and deposited at a predetermined thickness (e.g., 175 nm) that is thinner than the film thickness at which remarkable generation of dislocation and lattice relaxation actually begins.

Figure 21D:
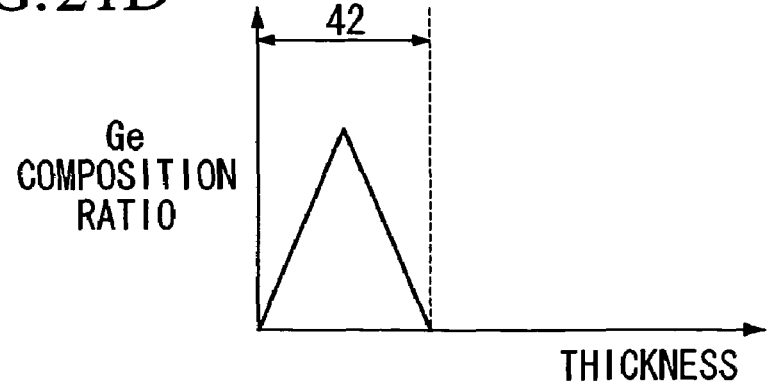

In addition, in a fourth example of the present embodiment as shown in FIG. 21D, the Ge composition ratio x of a first SiGe layer 42 is deposited at a predetermined thickness (e.g., 175 nm) while gradually increasing from nearly zero to 0.2, and then subsequently deposited at a predetermined thickness (e.g., 175 nm) while gradually decreasing Ge composition ratio x from 0.2 to nearly zero. Furthermore, the thickness of first SiGe layer 42 is set to be thinner than the film thickness at which remarkable generation of dislocation and lattice relaxation actually begin.

In these third and fourth examples, since both first SiGe layers 32 and 42 are formed at a film thickness that is thinner than the film thickness at which remarkable generation of dislocation and lattice relation actually begin, dislocation occurs concentrated at the interfaces on both sides of first SiGe layers 32 and 42 during deposition of second SiGe layer 3, thereby making it possible to reduce penetrating dislocation and surface roughness. Furthermore, in the fourth and fifth examples, since the maximum value of the Ge composition ratio in first SiGe layers 32 and 42 is not on the side of the interface with Si substrate 1, greater improvement effects on penetrating dislocation and surface roughness can be obtained than in the first and second embodiments.

Furthermore, the technical scope of the present invention is not limited to the aforementioned embodiments, but rather various modifications can be added within a range that does not deviate from the gist of the present invention.

For example, although five types of distributions were used in each of the aforementioned embodiments for the distribution of the Ge composition ratio versus film thickness in the first SiGe layer, other types of distribution may also be employed. For example, the first SiGe layer may be in the form of a multilayer film composed of a plurality of SiGe layers having different Ge composition ratios. In addition, the aforementioned multilayer film may also contain an Si layer.

In addition, although the composition was changed at a constant ratio relative to film thickness in the case of having changed the Ge composition ratio in the first SiGe layer in each of the aforementioned embodiments, a structure may also be employed in which that ratio is not constant.

Moreover, the first SiGe layer is only required to be a layer that contains Ge and accumulates strain energy, and other distributions of Ge composition ratios may also be employed.

In addition, although the composition of an incremental composition layer in which the Ge composition ratio is gradually increased towards the surface in the second SiGe layer was changed at a constant ratio versus film thickness in each of the aforementioned embodiments, a structure may also be employed in which that ratio is not constant.

In addition, although the second SiGe layer was arranged directly on the first SiGe layer in each of the aforementioned embodiments, the second SiGe layer may be arranged on the first SiGe layer with an Si layer in between.

In addition, an SiGe layer may be additionally deposited on the strained Si layer of a semiconductor wafer of each of the aforementioned embodiments.

In addition, although a semiconductor wafer having an SiGe layer was produced as a MOSFET substrate in each of the aforementioned embodiments, the substrate may be applied to other applications as well. For example, the semiconductor substrate and semiconductor substrate manufacturing method of the present invention may also be applied to a substrate for a solar cell or photo element. Namely, a solar cell substrate or photo element substrate may be produced by depositing a second SiGe layer and a third SiGe layer so that the uppermost surface is from 65% Ge to 100% Ge or 100% Ge, followed by depositing thereon InGaP (indium-gallium-phosphorous), GaAs (gallium-arsenide) or AlGaAs (aluminum-gallium-arsenide). In this case, a solar cell substrate is obtained having superior characteristics and low dislocation density.

[Second Experimental Example]

Next, the following indicates measurement results for penetrating dislocation density and surface roughness during actual production of a semiconductor substrate as claimed in the present invention.

The semiconductor substrate that was produced corresponds to the aforementioned sixth embodiment, the Ge composition ratio of the first SiGe layer 2 was made to be 0.2, and an epitaxial growth step for incremental composition layer 3a and constant composition layer 3b of second SiGe layer 3 was repeated five times. A plurality of semiconductor substrates were prepared by changing the film thickness of first SiGe layer 2. Furthermore, a semiconductor substrate was also prepared for the sake of comparison in which the second SiGe layer was in the form of a single incremental composition layer that did not contain a constant composition layer. In addition, a semiconductor substrate (STD) was also prepared that did not have a first SiGe layer, and the second SiGe layer was in the form of a single incremental composition layer that did not contain a constant composition layer in order to compare with the prior art.

Figure 22:
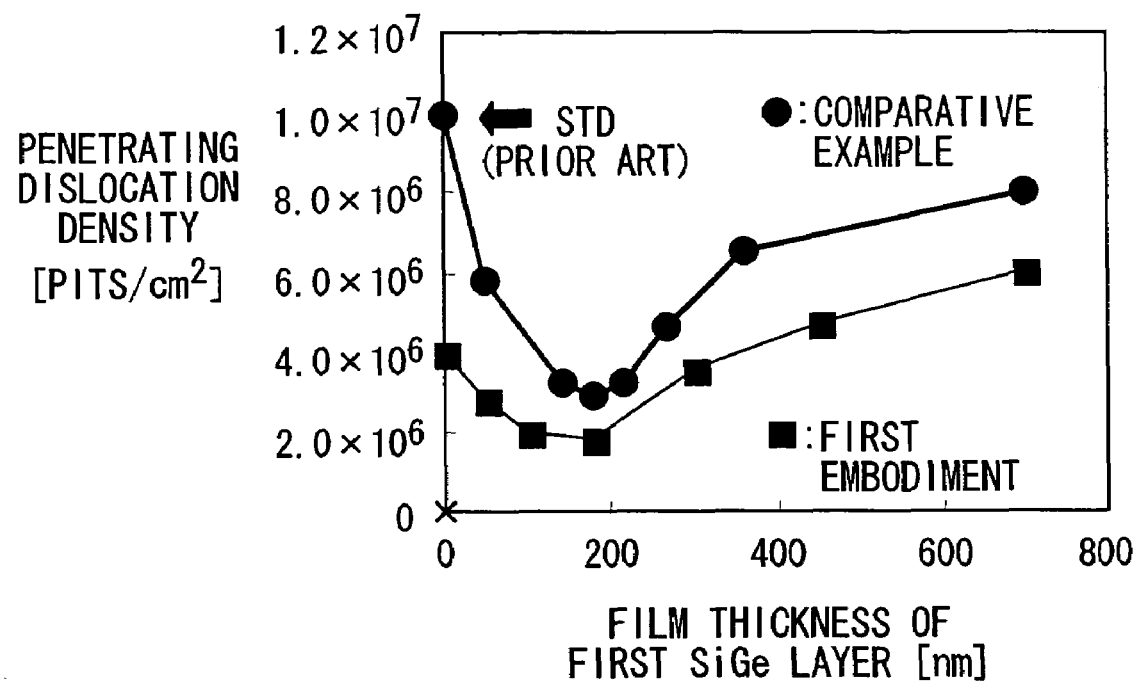
FIG. 22 is a graph showing the results of measuring penetrating dislocation density in the case of changing the film thickness of a first SiGe layer in an embodiment corresponding to a first embodiment as claimed in the present invention.
Figure 23:
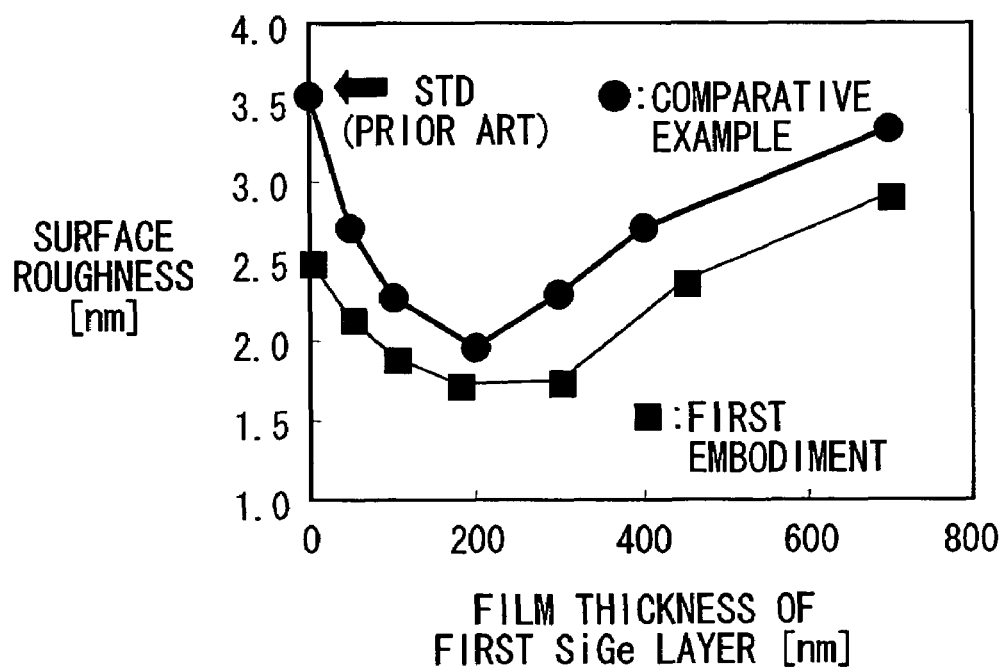
FIG. 23 is a graph showing the results of measuring surface roughness in the case of changing the film thickness of a first SiGe layer in an embodiment corresponding to a first embodiment as claimed in the present invention.

As a result, as shown in FIGS. 22 and 23, the semiconductor substrates provided with even a slight first SiGe layer exhibited lower penetrating dislocation density and surface roughness than the prior art (STD). In particular, low penetrating dislocation density and surface roughness were obtained over the range in which the first SiGe layer was 400 nm or less.

In the case of semiconductor substrates in which the second SiGe layer was in the form of a single incremental composition layer not containing a constant composition layer, those provided with even a slight first SiGe layer again exhibited lower penetrating dislocation density and surface roughness than the prior art (STD). In this case as well, low penetrating dislocation density and surface roughness were obtained over a range in which the first SiGe layer was 400 nm or less. However, penetrating dislocation density and surface roughness were poor as compared with the first embodiment, and it can be seen that as a result of employing a layer in the form of incremental steps consisting of an incremental composition layer and constant composition layer for the second SiGe layer, penetrating dislocation density and surface roughness were able to be reduced more effectively.

INDUSTRIAL APPLICABILITY

The present invention demonstrates the effects indicated below.

According to the semiconductor substrate and semiconductor substrate manufacturing method of the present invention, since the film thickness of a first SiGe layer is set to be thinner than twice the critical film thickness at which dislocation is generated and lattice relaxation occurs due to increased film thickness, the Ge composition ratio of a second SiGe layer is at least made to be lower than the intralayer maximum value of the first SiGe layer at the contact surface with the first SiGe layer or an Si substrate, and the second SiGe layer has an incremental composition layer in which the Ge composition ratio is gradually increased towards the surface at least in a portion thereof, dislocation can be efficiently concentrated at the interface between the Si substrate and first SiGe layer and in the vicinity of the interface between the first SiGe layer and the second SiGe layer, thereby enabling penetrating dislocation density and surface roughness of the surface of the second SiGe layer to be reduced.

In addition, according to the semiconductor substrate equipped with a strained Si layer and its semiconductor substrate manufacturing method of the present invention, since a strained Si layer is epitaxially grown directly on the SiGe layer or with another SiGe layer in between, an Si layer can be deposited on an SiGe layer having satisfactory surface conditions, thereby enabling the formation of a high-quality strained Si layer having few defects and a low level of surface roughness.

In addition, according to the field effect transistor and field effect transistor manufacturing method of the present invention, since a channel region is formed on a strained Si layer of the aforementioned semiconductor substrate of the present invention or semiconductor substrate produced according to the aforementioned semiconductor substrate manufacturing method of the present invention, a MOSFET offering even better characteristics can be obtained at high yield on a high-quality strained Si layer.

According to the semiconductor substrate and semiconductor substrate manufacturing method of the present invention, since the film thickness of a first SiGe layer is set to be thinner than twice the critical film thickness at which dislocation is generated and lattice relaxation occurs due to increased film thickness, a second SiGe layer is composed in the form of a multilayer laminated layer consisting of an SiGe incremental composition layer, in which the Ge composition ratio is gradually increased towards the surface, and an SiGe constant composition layer, which is arranged on the incremental composition layer at the Ge composition ratio of the upper surface of the incremental composition layer, at an alternating and continuous Ge composition ratio, and the Ge composition ratio of the lower surface of the second SiGe layer is lower than the intralayer maximum value of the Ge composition ratio in the first SiGe layer, together with dislocation being able to be efficiently concentrated at the interface between the Si substrate and first SiGe layer and in the vicinity of the interface between the first SiGe layer and the second SiGe layer, dislocation can be made to propagate in the lateral direction thereby preventing from penetrating and appearing on the surface. Thus, as a result of these synergistic effects, a high-quality crystalline substrate can be obtained having low levels of penetrating dislocation density and surface roughness.

In addition, according to the field effect transistor and field effect transistor manufacturing method of the present invention, since a channel region is formed on a strained Si layer of the aforementioned semiconductor substrate of the present invention or semiconductor substrate produced according to the aforementioned semiconductor substrate manufacturing method of the present invention, a MOSFET offering even better characteristics can be obtained at high yield on a high-quality strained Si layer.

The invention claimed is:

1. A semiconductor substrate comprising:
   an Si substrate;
   a first SiGe layer on the Si substrate; and
   a second SiGe layer on the first SiGe layer either directly or with an Si layer arranged between the second SiGe layer and the first SiGe layer;
   wherein the first SiGe layer has a film thickness that is thinner than twice a critical thickness at which dislocation occurs resulting in lattice relaxation due to increased film thickness,
   a Ge composition ratio of the second SiGe layer is at least lower than an intralayer maximum value of a Ge composition ratio in the first SiGe layer or in the first SiGe layer at a contact surface with the Si layer, and the second SiGe layer has an incremental composition region in which the Ge composition ratio gradually increases towards a surface of the second SiGe layer at least in a portion thereof.

2. A semiconductor substrate according to claim 1 wherein,
   the Ge composition ratio x of the first SiGe layer is constant, and the first SiGe layer has a thickness that is less than twice the critical thickness $t_c$ which satisfies the following relational expression:

$t_c(\text{nm}) = (1.9 \times 10^{-3}/\epsilon(x)^2) \cdot \ln(t_c/0.4)$ $\epsilon(x) = (0.0200326x + 0.0026174x^2)/a_0$ $a_0 = 0.543$ nm ($a_0$ is the lattice constant of Si).

3. A semiconductor substrate according to claim 1, wherein the Ge composition ratio x of the first SiGe layer is not less than 0.05 and is not more than 0.3.

4. A semiconductor substrate according to claim 1, wherein the second SiGe layer is arranged directly on the first SiGe layer, and an entire portion of the second SiGe layer is an incremental composition layer in which the Ge composition ratio is gradually increased towards the surface.

5. A semiconductor substrate provided with a strained Si layer on the second SiGe layer of the semiconductor substrate according to claim 1 either directly or with another SiGe layer in between.

6. A field effect transistor comprising:
   an SiGe layer;
   a strained Si layer on the SiGe layer; and
   a channel region in the strained Si layer, wherein
   the channel region is formed in the strained Si layer of the semiconductor substrate according to claim 5.

7. A manufacturing method of a semiconductor substrate in which an SiGe layer is epitaxially grown on an Si substrate, the method comprising:
   a first layer formation step in which a first SiGe layer is epitaxially grown on the Si substrate, and
   a second layer formation step in which a second SiGe layer is epitaxially grown on the first SiGe layer either directly or with an epitaxially grown Si layer arranged between the first SiGe layer and the second SiGe layer;
   wherein, in the first layer formation step, the film thickness of the first SiGe layer is set to be thinner than twice a critical film thickness, which is the film thickness at which dislocation occurs resulting in lattice relaxation due to increased film thickness, and
   in the second layer formation step, a Ge composition ratio of the second SiGe layer is at least lower than the intralayer maximum value of the Ge composition ratio in the first SiGe layer or in the first SiGe layer at a contact surface with the Si layer, and an incremental composition region is formed in which the Ge composition ratio is increased gradually towards a surface of the second SiGe layer in at least a portion thereof.

8. A semiconductor substrate manufacturing method according to claim 7, wherein
   in the first film formation step, the Ge composition ratio x of the first SiGe layer is constant, and the first SiGe layer is made to have a thickness that is less than twice the critical film thickness $t_c$ which satisfies the following relational expression:

$t_c(\text{nm}) = (1.9 \times 10^{-3}/\epsilon(x)^2) \cdot \ln(t_c/0.4)$ $\epsilon(x) = (0.0200326x + 0.0026174x^2)/a_0$ $a_0 = 0.543$ nm ($a_0$ is the lattice constant of Si).

9. A semiconductor substrate manufacturing method according to claim 7, wherein the Ge composition ratio x of the first SiGe layer is not less than 0.05 and is not more than 0.3.

10. The semiconductor substrate manufacturing method according to claim 7, wherein the second SiGe layer is arranged directly on the first SiGe layer, and the entire layer is an incremental composition layer in which the Ge composition ratio is gradually increased towards the surface.

11. A semiconductor substrate manufacturing method in which a strained Si layer is formed on an Si substrate with an SiGe layer in between comprising:
    epitaxially growing the strained Si layer on the second SiGe layer of a semiconductor substrate produced by a semiconductor substrate manufacturing method according to claim 7 either directly or with another SiGe layer in between.

12. A field effect transistor manufacturing method in which a channel region is formed in a stained Si layer epitaxially grown on an SiGe layer, comprising:
   forming the channel region in the strained Si layer of a semiconductor substrate produced by a semiconductor substrate manufacturing method according to claim 11.

13. A semiconductor substrate in which an SiGe layer is formed on an Si substrate, comprising:
   the semiconductor substrate being produced by a semiconductor substrate manufacturing method according to claim 7.

14. A semiconductor substrate in which a strained Si layer is formed on an Si substrate with an SiGe layer in between, comprising:
   the semiconductor substrate being produced by a semiconductor substrate manufacturing method according to claim 11.

15. A field effect transistor in which a channel region is formed in a strained Si layer epitaxially grown on an SiGe layer, comprising:
   the field effect transistor being produced by the field effect transistor manufacturing method according to claim 12.

16. A semiconductor substrate comprising:
   an Si substrate,
   a first SiGe layer on the Si substrate, and
   a second SiGe layer on the first SiGe layer either directly or with an Si layer arranged between the second SiGe layer and the first SiGe layer,
   wherein the first SiGe layer has a film thickness that is thinner than twice a critical film thickness, which is the film thickness at which dislocation occurs resulting in lattice relaxation due to increased film thickness,
   the second SiGe layer is composed in the form of a multilayer laminated layer consisting of an SiGe incremental composition layer, in which a Ge composition ratio is gradually increased towards a surface of the second SiGe layer, and an SiGe constant composition layer, which is arranged on the incremental composition layer at the Ge composition ratio of the upper surface of the incremental composition layer, at an alternating and continuous Ge composition ratio, and
   the Ge composition ratio of the lower surface of the second SiGe layer is lower than the intralayer maximum value of the Ge composition ratio in the first SiGe layer.

17. A semiconductor substrate according to claim 16, wherein the Ge composition ratio x of the first SiGe layer is constant, and the first SiGe layer has a thickness that is less than twice the critical film thickness $t_c$ which satisfies the following relational expression:

$$t_c(\text{nm}) = (1.9 \times 10^{-3}/\epsilon(x)^2) \cdot \ln(t_c/0.4)$$

$$\epsilon(x) = (0.0200326x + 0.0026174x^2)/a_0$$

$a_0 = 0.543$ nm ($a_0$ is the lattice constant of Si).

18. A semiconductor substrate according to claim 16, wherein the Ge composition ratio x of the first SiGe layer is not less than 0.05 and is not more than 0.3.

19. A semiconductor substrate according to claim 16, further comprising a strained Si layer arranged on the second SiGe layer either directly or with another SiGe layer therebetween.

20. A field effect transistor having a channel region in a strained Si layer on an SiGe layer, comprising a semiconductor substrate according to claim 19, wherein the channel region is provided in the strained Si layer of the semiconductor substrate.

21. A manufacturing method of a semiconductor substrate in which an SiGe layer is epitaxially grown on an Si substrate, comprising:
   a first layer formation step in which a first SiGe layer is epitaxially grown on the Si substrate, and
   a second layer formation step in which a second SiGe layer is epitaxially grown on the first SiGe layer either directly or with an epitaxially grown Si layer arranged between the first SiGe layer and the second SiGe layer,
   wherein, in the first layer formation step, the film thickness of the first SiGe layer is set to be thinner than twice a critical film thickness, which is the film thickness at which dislocation occurs resulting in lattice relaxation due to increased film thickness, and
   in the second layer formation step, a step in which an SiGe incremental composition layer, in which a Ge composition ratio is gradually increased towards a surface of the second SiGe layer, is epitaxially grown, and
   a step in which an SiGe constant composition layer is epitaxially grown on the incremental composition layer at a final Ge composition ratio of the incremental composition layer, are repeated a plurality of times at a continuous Ge composition ratio, the second SiGe layer is deposited in which the Ge composition ratio changes in steps at an increment in the direction of deposition, and
   the Ge composition ratio of the lower surface of the second SiGe layer is lower than the intralayer maximum value of the Ge composition ratio in the first SiGe layer.

22. A semiconductor substrate manufacturing method according to claim 21, wherein
   in the first film formation step, the Ge composition ratio x of the first SiGe layer is constant, and the first SiGe layer is made to have a thickness that is less than twice the critical film thickness $t_c$ which satisfies the following relational expression:

$$t_c(\text{nm}) = (1.9 \times 10^{-3}/\epsilon(x)^2) \cdot \ln(t_c/0.4)$$

$$\epsilon(x) = (0.0200326x + 0.0026174x^2)/a_0$$

$a_0 = 0.543$ nm ($a_0$ is the lattice constant of Si).

23. A semiconductor substrate manufacturing method according to claim 21, wherein the Ge composition ratio x of the first SiGe layer is not less than 0.05 and is not more than 0.3.

24. A semiconductor substrate manufacturing method in which a strained Si layer is formed on an Si substrate with an SiGe layer in between, the method comprising:
   epitaxially growing the strained Si layer on the second SiGe layer of a semiconductor substrate produced by a semiconductor substrate manufacturing method according to claim 21 either directly or with another SiGe layer in between.

25. A field effect transistor manufacturing method in which a channel region is formed in a stained Si layer epitaxially grown on an SiGe layer, comprising:
   forming the channel region in the strained Si layer of a semiconductor substrate produced by a semiconductor substrate manufacturing method according to claim 24.

26. A semiconductor substrate comprising an Si substrate and an SiGe layer formed on the Si substrate, the semiconductor substrate being produced by a semiconductor substrate manufacturing method according to claim 21.

27. A semiconductor substrate comprising an Si substrate, a strained Si layer formed on the Si substrate with an SiGe layer in between, the semiconductor substrate being produced by a semiconductor substrate manufacturing method according to claim 24.

28. A field effect transistor in which a channel region is formed in a strained Si layer epitaxially grown on an SiGe layer, the field effect transistor being produced by the field effect transistor manufacturing method according to claim 25.

* * * * *